(12) United States Patent
Noudo

(10) Patent No.: US 11,387,265 B2
(45) Date of Patent: Jul. 12, 2022

(54) IMAGE CAPTURING ELEMENT AND IMAGE CAPTURING DEVICE

(71) Applicant: SONY SEMICONDUCTOR SOLUTIONS CORPORATION, Kanagawa (JP)

(72) Inventor: Shinichiro Noudo, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 83 days.

(21) Appl. No.: 16/643,940

(22) PCT Filed: Sep. 19, 2018

(86) PCT No.: PCT/JP2018/034546
§ 371 (c)(1),
(2) Date: Mar. 3, 2020

(87) PCT Pub. No.: WO2019/092988
PCT Pub. Date: May 16, 2019

(65) Prior Publication Data
US 2020/0411570 A1 Dec. 31, 2020

(30) Foreign Application Priority Data
Nov. 13, 2017 (JP) .............................. JP2017-217885

(51) Int. Cl.
*H01L 27/14* (2006.01)
*H01L 27/146* (2006.01)
(Continued)

(52) U.S. Cl.
CPC .. *H01L 27/14605* (2013.01); *H01L 27/14621* (2013.01); *H01L 27/14812* (2013.01); *H04N 5/359* (2013.01); *H04N 5/374* (2013.01)

(58) Field of Classification Search
CPC ......... H01L 27/14605; H01L 27/14621; H01L 27/14623; H01L 27/14625; H01L 27/14812; H04N 5/359; H04N 5/374
See application file for complete search history.

(56) References Cited

U.S. PATENT DOCUMENTS 10,403,665 B2 * 9/2019 Yokogawa ........ H01L 27/14621
2021/0160463 A1 * 5/2021 Taguchi ............ H01L 27/14621

FOREIGN PATENT DOCUMENTS

| CN | 108028260 A | 5/2018 |
|---|---|---|
| CN | 108369949 A | 8/2018 |

(Continued)

OTHER PUBLICATIONS

International Search Report and Written Opinion of PCT Application No. PCT/JP2018/034546, dated Nov. 27, 2018, 09 pages of ISRWO.

*Primary Examiner* — Kevin K Pyo
(74) *Attorney, Agent, or Firm* — Chip Law Group

(57) ABSTRACT

To reduce occurrence of crosstalk in a back-illuminated image capturing element. An image capturing element includes: a pixel including a photoelectric conversion section, a pixel circuit, and a wiring layer; and a polarization section. The photoelectric conversion section is formed on a semiconductor substrate and performs photoelectric conversion based on incident light. The pixel circuit generates an image signal according to a charge generated by the photoelectric conversion. The wiring layer is arranged on a surface of the semiconductor substrate and is configured to transmit any one of the image signal or a signal applied to the pixel circuit, the surface being different from a surface of the semiconductor substrate on which the incident light is incident. The polarization section is arranged between the semiconductor substrate and the wiring layer, and allows (Continued)

transmission of light in a specific polarization direction among incident light transmitted through the photoelectric conversion section.

15 Claims, 24 Drawing Sheets

(51) Int. Cl.
*H01L 27/148* (2006.01)
*H04N 5/359* (2011.01)
*H04N 5/374* (2011.01)

(56) References Cited

FOREIGN PATENT DOCUMENTS

| JP | 2008-147333 A | 6/2008 |
| JP | 2017-076684 A | 4/2017 |
| JP | 2017-126678 A | 7/2017 |
| WO | 2017/064845 A1 | 4/2017 |
| WO | 2017/098779 A1 | 6/2017 |

\* cited by examiner

IMAGE CAPTURING ELEMENT AND IMAGE CAPTURING DEVICE

CROSS REFERENCE TO RELATED APPLICATIONS

This application is a U.S. National Phase of International Patent Application No. PCT/JP2018/034546 filed on Sep. 19, 2018, which claims priority benefit of Japanese Patent Application No. JP 2017-217885 filed in the Japan Patent Office on Nov. 13, 2017. Each of the above-referenced applications is hereby incorporated herein by reference in its entirety.

TECHNICAL FIELD

The present technology relates to an image capturing element and an image capturing device. More specifically, the present technology relates to an image capturing element in which incident light is radiated to a back surface of a semiconductor substrate, and an image capturing device.

BACKGROUND ART

Conventionally, an image capturing element in which pixels each including a photoelectric conversion section that performs photoelectric conversion of incident light are arranged in a two-dimensional array form has been used. In each pixel, an on-chip lens or a color filter is provided, and an image signal corresponding to a different color is generated for each pixel. As the image capturing element, a back-illuminated image capturing element is used in which a wiring layer is formed adjacent to a semiconductor substrate on which the photoelectric conversion section of the pixel is formed, and incident light is radiated to the photoelectric conversion section from a surface of the semiconductor substrate that is different from the surface on which the wiring layer is formed. The back-illuminated image capturing element has an improved photoelectric conversion efficiency by grinding the back surface of the semiconductor substrate after forming the wiring layer to realize a small thickness.

In order to further improve the sensitivity of such a back-illuminated image capturing element, an image capturing element in which a reflection layer is provided between a semiconductor substrate on which a photoelectric conversion section is formed and a wiring layer has been proposed (for example, see Patent Document 1). Long-wavelength light such as red light, infrared light, or the like has a small absorption coefficient in a semiconductor such as silicon (Si) or the like which constitutes the photoelectric conversion section. That is, the light is hardly subjected to photoelectric conversion and it is highly likely that the light will transmit through the photoelectric conversion section. Therefore, in the above-described image capturing element, the sensitivity is improved by reflecting the incident light transmitted through the photoelectric conversion section without contributing to the photoelectric conversion to make the incident light be incident again on the photoelectric conversion section.

CITATION LIST

Patent Document

Patent Document 1: Japanese Patent Application Laid-Open No. 2008-147333

SUMMARY OF THE INVENTION

Problems to be Solved by the Invention

In the above-described related art, when the incident light transmitted through the photoelectric conversion section is reflected by the reflection layer, the incident light may be incident on a photoelectric conversion section of an adjacent pixel. For example, reflected light may be further reflected at an interface between the semiconductor substrate and an insulating film formed on a surface of the semiconductor substrate and be incident on a photoelectric conversion section of an adjacent pixel. In such a case, crosstalk of the image signal occurs. Here, the crosstalk is a phenomenon in which an image signal is changed due to incidence of light other than light from a subject such as the above-described reflected light or the like. In an image capturing element that generates a monochrome image signal, a decrease in resolution is caused. On the other hand, in an image capturing element that generates a color image signal, color filters that allow transmission of light having different wavelengths are arranged in two adjacent pixels, respectively. When light incident on a pixel via a color filter becomes reflected light, and the reflected light is incident on a photoelectric conversion section without passing through a color filter of an adjacent pixel and is converted into an image signal, an image signal including information of a different color is generated. Therefore, crosstalk generated in the image capturing element that generates a color image signal causes color mixing. As described above, in the above-described related art, image quality is deteriorated due to crosstalk, which is problematic.

The present technology has been made to solve the above-described problems, and a first aspect of the present technology is an image capturing element including: a pixel that includes a photoelectric conversion section formed on a semiconductor substrate and configured to perform photoelectric conversion based on incident light, a pixel circuit configured to generate an image signal according to a charge generated by the photoelectric conversion, and a wiring layer arranged on a surface of the semiconductor substrate and configured to transmit any one of the image signal or a signal applied to the pixel circuit, the surface being different from a surface of the semiconductor substrate on which the incident light is incident; and a polarization section that is arranged between the semiconductor substrate and the wiring layer and allows transmission of light in a specific polarization direction among the incident light transmitted through the photoelectric conversion section. This brings about an effect that light in a specific polarization direction among incident light transmitted through the photoelectric conversion section is transmitted through the polarization section. In a case where a polarization section configured to implement a different polarization direction is arranged in an adjacent pixel, light incident on the adjacent pixel due to reflection by the wiring layer passes through two polarization sections of which polarization directions are different from each other, such that the light incident on an adjacent pixel is assumed to be attenuated.

Furthermore, according to the first aspect, the polarization section may be configured with a wire grid. This brings about an effect that the polarization section configured with the wire grid is arranged.

Furthermore, according to the first aspect, a plurality of the polarization sections may be arranged between the semiconductor substrate and the wiring layer. This brings about an effect that incident light transmitted through the photoelectric conversion section is transmitted through the plurality of polarization sections.

Furthermore, according to the first aspect, the plurality of polarization sections may be configured to implement same polarization directions, respectively. This brings about an effect that incident light transmitted through the photoelectric conversion section is transmitted through a plurality of polarization sections configured to implement the same polarization direction.

Furthermore, according to the first aspect, the polarization section may be formed simultaneously with the wiring layer. This brings about an effect that the polarization section formed simultaneously with the wiring layer is arranged.

Furthermore, according to the first aspect, the image capturing element may include a plurality of the pixels arranged two-dimensionally, and the polarization section arranged in each of the plurality of pixels. This brings about an effect that the plurality of pixels each in which the polarization section is arranged are arranged two-dimensionally.

Furthermore, according to the first aspect, in the plurality of polarization sections, adjacent polarization sections may be configured to implement different polarization directions, respectively. This brings about an effect that the polarization sections configured to implement different polarization directions, respectively, are arranged in adjacent pixels, respectively.

Furthermore, according to the first aspect, each of the plurality of pixels may further includes one of a plurality of color filters that allows transmission of light having different wavelengths among the incident light and makes the light transmitted therethrough be incident on the photoelectric conversion section. This brings about the effect that the color filter and the polarization section are arranged in the pixel, respectively.

Furthermore, according to the first aspect, the polarization section arranged in the pixel including a color filter that allows transmission of light having a predetermined wavelength among the plurality of color filters may be configured to implement a polarization direction different from that of an adjacent polarization section. This brings about an effect that a polarization section configured to implement a different polarization direction is arranged in a pixel adjacent to the pixel including the color filter that allows transmission of the light having the predetermined wavelength.

Furthermore, according to the first aspect, the color filter that allows transmission of the light having the predetermined wavelength may be a color filter that allows transmission of red light. This brings about an effect that a polarization section configured to implement a different polarization direction is arranged in a pixel adjacent to the pixel including the color filter corresponding to the red light.

Furthermore, according to the first aspect, the color filter that allows transmission of the light having the predetermined wavelength may be a color filter that allows transmission of white light. This brings about an effect that a polarization section configured to implement a different polarization direction is arranged in a pixel adjacent to the pixel including the color filter corresponding to the white light.

Furthermore, according to the first aspect, the color filter that allows transmission of the light having the predetermined wavelength may be a color filter that allows transmission of infrared light. This brings about an effect that a polarization section configured to implement a different polarization direction is arranged in a pixel adjacent to the pixel including the color filter corresponding to the infrared light.

Furthermore, according to the first aspect, each of the plurality of pixels may further include a second polarization section that allows transmission of light in a specific polarization direction among the incident light and makes the light transmitted therethrough be incident on the photoelectric conversion section. This brings about an effect that incident light transmitted through the second polarization section is incident on the photoelectric conversion section.

Furthermore, according to the first aspect, the second polarization section may be configured to implement the same polarization direction as that of the polarization section arranged in the pixel in which the second polarization section is arranged. This brings about an effect that incident light in the same polarization direction as that of the polarization section is transmitted through the photoelectric conversion section and is incident on the polarization section.

Furthermore, according to the first aspect, the second polarization section may be configured to implement a polarization direction different from that of the polarization section arranged in the pixel in which the second polarization section is arranged. This brings about an effect that incident light in a polarization direction different from that of the polarization section is transmitted through the photoelectric conversion section and is incident on the polarization section.

Furthermore, a second aspect of the present technology is an image capturing device including: a pixel that includes a photoelectric conversion section formed on a semiconductor substrate and configured to perform photoelectric conversion based on incident light, a pixel circuit configured to generate an image signal according to a charge generated by the photoelectric conversion, and a wiring layer arranged on a surface of the semiconductor substrate and configured to transmit any one of the image signal or a signal applied to the pixel circuit, the surface being different from a surface of the semiconductor substrate on which the incident light is incident; a polarization section that is arranged between the semiconductor substrate and the wiring layer and allows transmission of light in a specific polarization direction among the incident light transmitted through the photoelectric conversion section; and a processing circuit that processes the transmitted image signal. This brings about an effect that light in a specific polarization direction among incident light transmitted through the photoelectric conversion section is transmitted through the polarization section. In a case where a polarization section configured to implement a different polarization direction is arranged in an adjacent pixel, light incident on the adjacent pixel due to reflection by the wiring layer passes through two polarization sections of which polarization directions are different from each other, such that the light incident on an adjacent pixel is assumed to be attenuated.

Effects of the Invention

According to the present technology, an excellent effect of reducing occurrence of crosstalk in the image capturing element and preventing deterioration of image quality is achieved.

BRIEF DESCRIPTION OF DRAWINGS

FIGS. 17A, 17B, 7C, and 7D are views illustrating an example of a method of producing the polarization section according to the fifth embodiment of the present technology.

MODE FOR CARRYING OUT THE INVENTION

Next, an embodiment for implementing the present technology (hereinafter, referred to as embodiment) will be described with reference to the drawings. In the following drawings, the same or similar parts are denoted by the same or similar reference signs. However, the drawings are schematic, and dimensional ratios and the like of the respective parts do not always coincide with actual ones. Furthermore, it is needless to say that dimensional relationships or ratios of some portions are different between drawings. Furthermore, embodiments will be described in the following order.

1. First Embodiment
2. Second Embodiment
3. Third Embodiment
4. Fourth Embodiment
5. Fifth Embodiment
6. Sixth Embodiment
7. Example of Application to Camera
8. Example of Application to Endoscopic Operation System
9. Example of Application to Moving Body 1. First Embodiment

[Configuration of Image Capturing Element]

Figure 1:
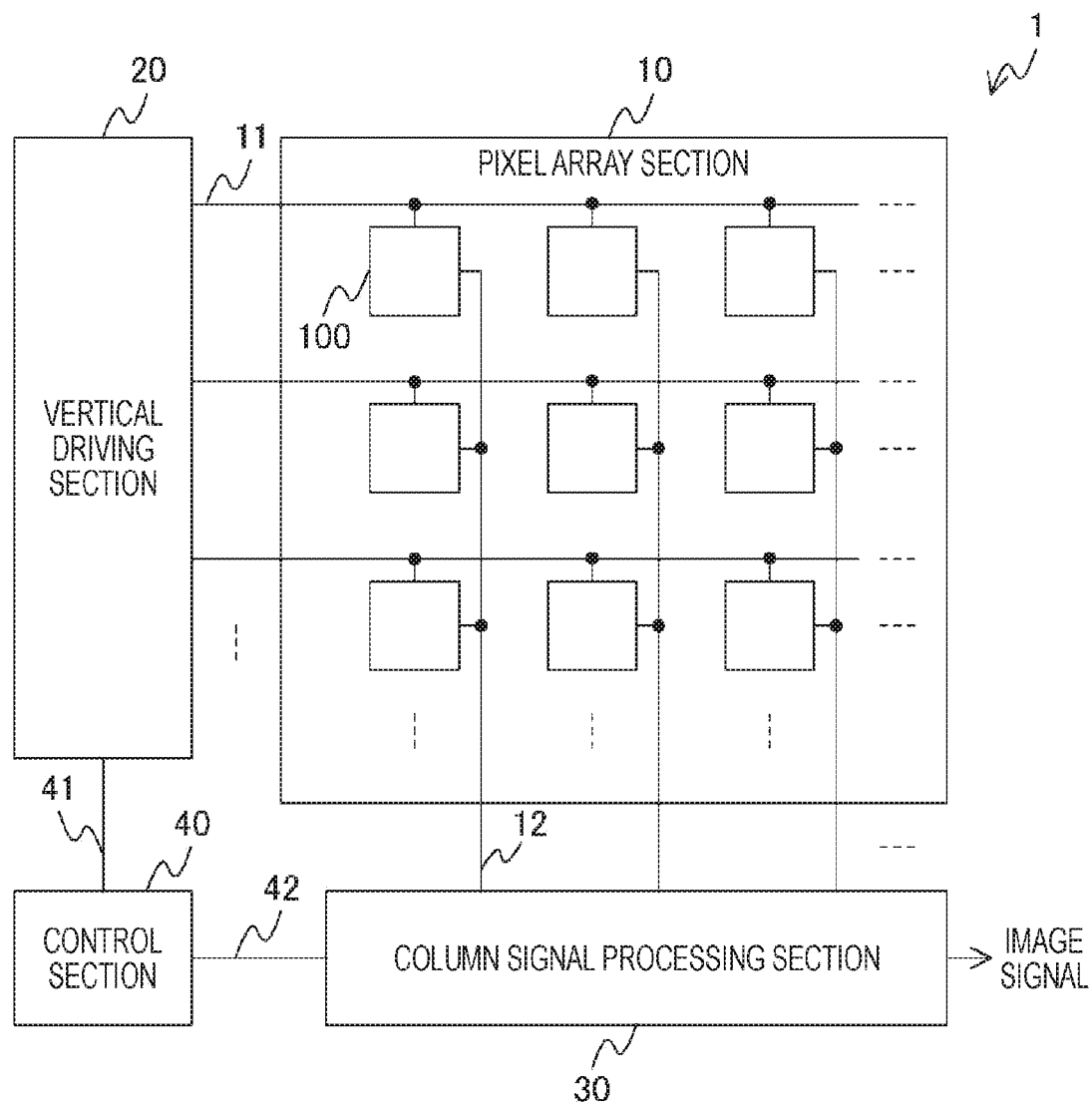
FIG. 1 is a diagram illustrating an example of a configuration of an image capturing element according to an embodiment of the present technology.

FIG. 1 is a diagram illustrating an example of a configuration of an image capturing element according to an embodiment of the present technology. The image capturing element 1 in FIG. 1 includes a pixel array section 10, a vertical driving section 20, a column signal processing section 30, and a control section 40.

The pixel array section 10 is configured such that pixels 100 are arranged in a two-dimensional lattice form. Here, the pixel 100 generates an image signal corresponding to radiated light. The pixel 100 includes a photoelectric conversion section that generates a charge according to the radiated light. Further, the pixel 100 further includes a pixel circuit. The pixel circuit generates an image signal based on the charge generated by the photoelectric conversion section. The generation of the image signal is controlled by a control signal generated by the vertical driving section 20 as described later. In the pixel array section 10, signal lines 11 and 12 are arranged in an X-Y matrix form. The signal line 11 is a signal line for transmitting a control signal for the pixel circuit in the pixel 100, is arranged for each row of the pixel array section 10, and is commonly wired to the pixels 100 arranged in each row. The signal line 12 is a signal line for transmitting an image signal generated by the pixel circuit of the pixel 100, is arranged for each column of the pixel array section 10, and is commonly wired to the pixels 100 arranged in each column. The photoelectric conversion section and the pixel circuit are formed on a semiconductor substrate.

The vertical driving section 20 generates a control signal for the pixel circuit of the pixel 100. The vertical driving section 20 transmits the generated control signal to the pixel 100 via the signal line 11 in FIG. 1. The column signal processing section 30 processes an image signal generated by the pixel 100. The column signal processing section 30 processes an image signal transmitted from the pixel 100 via the signal line 12 in FIG. 1. The processing in the column signal processing section 30 corresponds to, for example, analog-to-digital conversion for converting an analog image signal generated in the pixel 100 into a digital image signal. The image signal processed by the column signal processing section 30 is output as an image signal of the image capturing element 1. The control section 40 controls the entire image capturing element 1. The control section 40 generates and outputs a control signal for controlling the vertical driving section 20 and the column signal processing section 30 to control the image capturing element 1. The control signal generated by the control section 40 is transmitted to the vertical driving section 20 and the column signal processing section 30 via signal lines 41 and 42, respectively.

[Configuration of Pixel]

Figure 2:
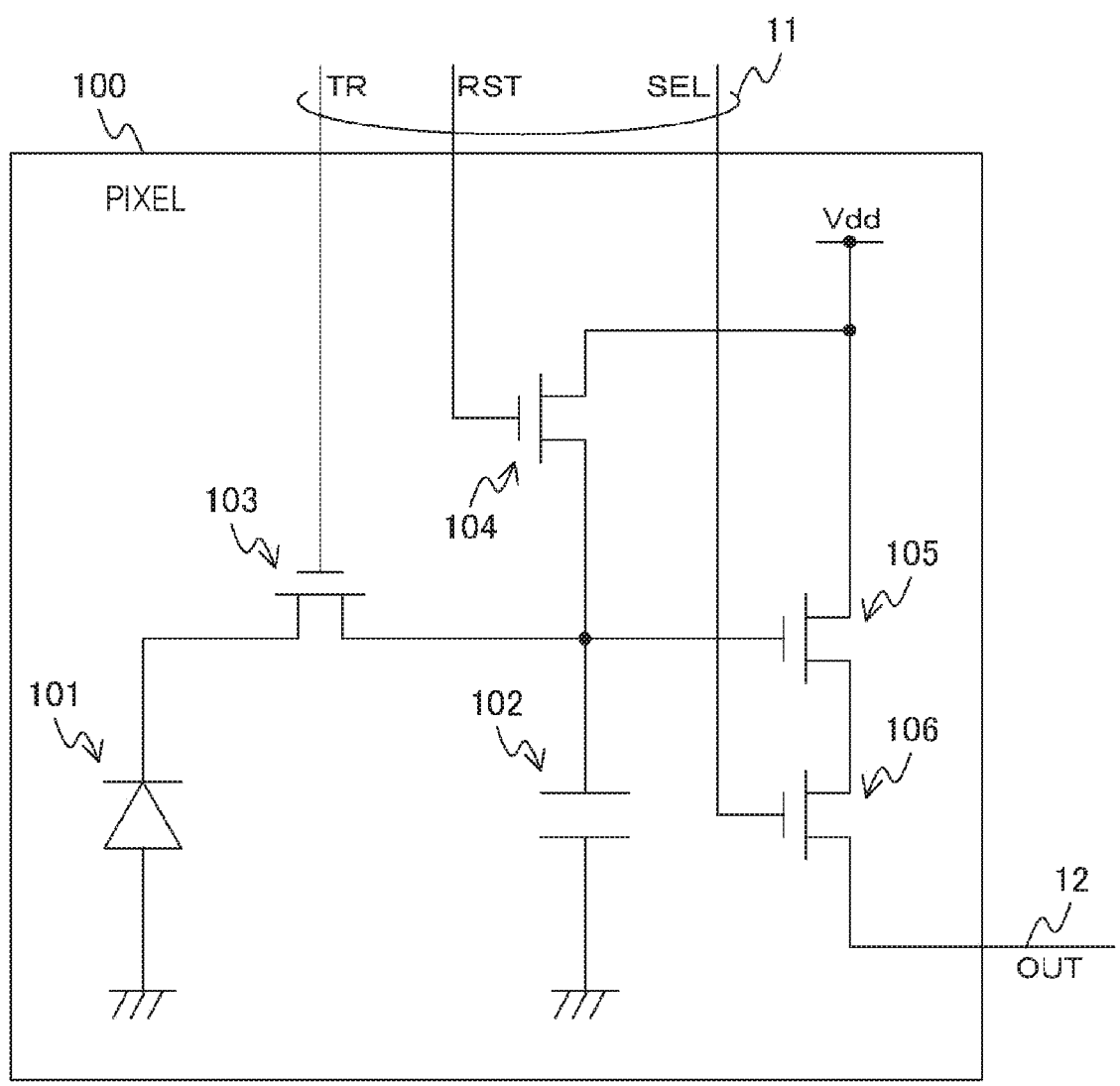
FIG. 2 is a diagram illustrating an example of a configuration of a pixel according to an embodiment of the present technology.

FIG. 2 is a diagram illustrating an example of a configuration of the pixel according to an embodiment of the present technology. FIG. 2 is a circuit diagram illustrating an example of a configuration of the pixel 100. The pixel 100 in FIG. 2 includes a photoelectric conversion section 101, a charge holding section 102, and metal-oxide-semiconductor (MOS) transistors 103 to 106.

An anode of the photoelectric conversion section 101 is grounded, and a cathode of the photoelectric conversion section 101 is connected to a source of the MOS transistor 103. A drain of the MOS transistor 103 is connected to a source of the MOS transistor 104, a gate of the MOS transistor 105, and one end of the charge holding section 102. The other end of the charge holding section 102 is grounded. Drains of the MOS transistors 105 and 106 are commonly connected to a power supply line Vdd, and a source of the MOS transistor 105 is connected to the drain of the MOS transistor 106. A source of the MOS transistor 106 is connected to an output signal line OUT. Gates of the MOS transistors 103, 104, and 106 are connected to a transfer signal line TR, a reset signal line RST, and a selection signal line SEL, respectively. Note that the transfer signal line TR, the reset signal line RST, and the selection signal line SEL form the signal line 11. Furthermore, the output signal line OUT forms the signal line 12.

The photoelectric conversion section 101 generates a charge according to the radiated light as described above. For the photoelectric conversion section 101, a photodiode can be used. Furthermore, the charge holding section 102 and the MOS transistors 103 to 106 form the pixel circuit.

The MOS transistor 103 is a transistor that transfers the charge generated by photoelectric conversion performed by the photoelectric conversion section 101 to the charge holding section 102. The transfer of charge in the MOS transistor 103 is controlled by a signal transmitted via the transfer signal line TR. The charge holding section 102 is a capacitor that holds the charge transferred by the MOS transistor 103. The MOS transistor 105 is a transistor that generates a signal based on the charge held in the charge holding section 102. The MOS transistor 106 is a transistor that outputs, as an image signal, the signal generated by the MOS transistor 105 to the output signal line OUT. The MOS transistor 106 is controlled by a signal transmitted via the selection signal line SEL.

The MOS transistor 104 is a transistor that resets the charge holding section 102 by discharging the charge held in the charge holding section 102 to the power supply line Vdd. The reset performed by the MOS transistor 104 is controlled by a signal transmitted via the reset signal line RST, and is performed before the transfer of the charge performed by the MOS transistor 103. Note that, at the time of the reset, the photoelectric conversion section 101 can also be reset by turning on the MOS transistor 103. As such, the pixel circuit converts the charge generated by the photoelectric conversion section 101 into an image signal.

Figure 3:
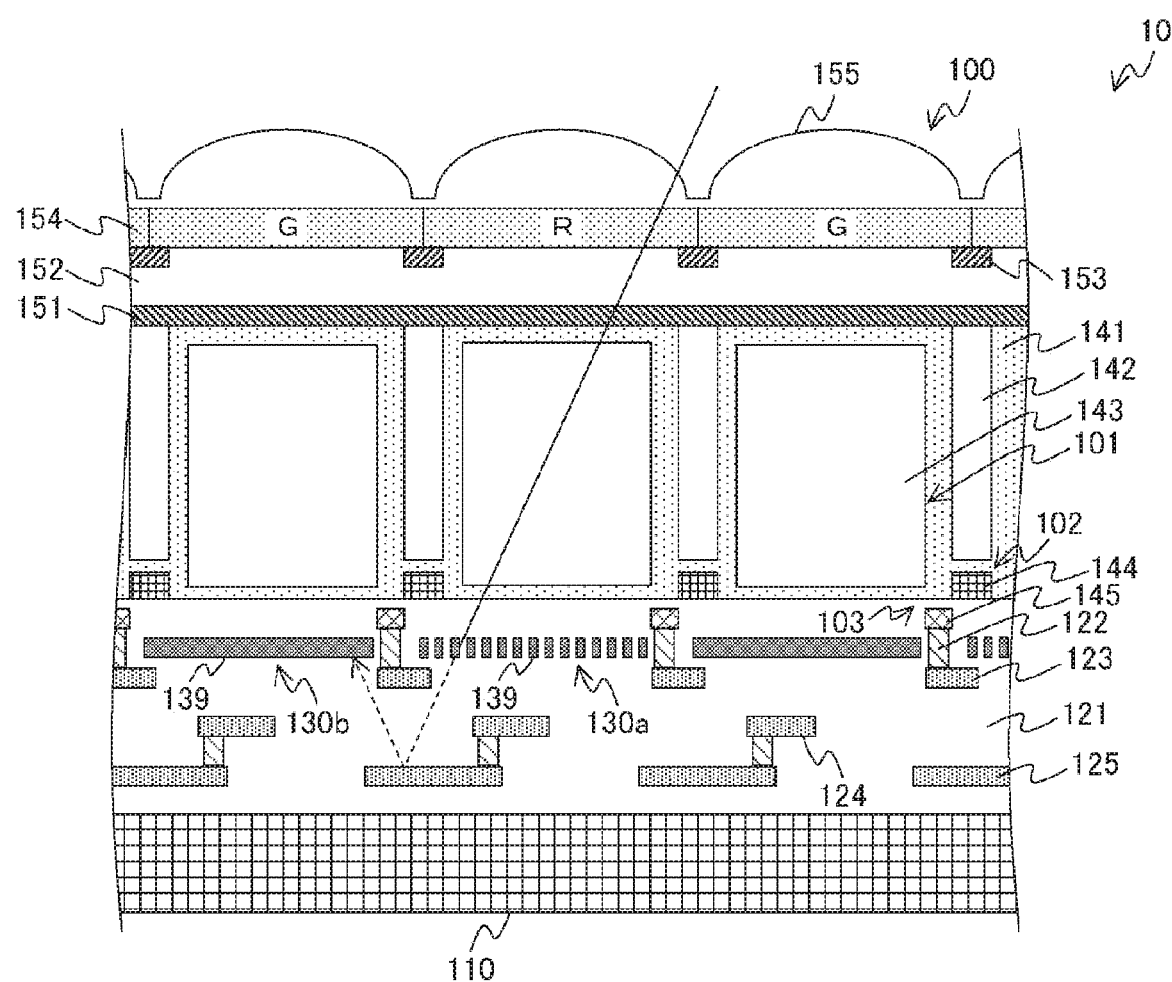
FIG. 3 is a view illustrating an example of a configuration of a pixel according to a first embodiment of the present technology.

FIG. 3 is a view illustrating an example of a configuration of a pixel according to a first embodiment of the present technology. FIG. 3 is a schematic cross-sectional view illustrating an example of a configuration of a pixel 100 arranged in the pixel array section 10. The pixel 100 includes an on-chip lens 155, a color filter 154, a light-shielding film 153, a planarizing film 152, an insulating film 151, a semiconductor substrate 141, an insulating layer 121, wiring layers 123 to 125, a polarization section 130, and a support substrate 110.

The on-chip lens 155 is a lens that focuses incident light on a photoelectric conversion section 101. The on-chip lens 155 is arranged for each pixel 100.

The color filter 154 is an optical filter that allows transmission of light having a predetermined wavelength. Examples of the color filter 154 can include three color filters that allow transmission of red light, green light, and blue light. In this case, one of the color filters that allow transmission of red light, green light, and blue light is arranged in the pixel 100. Hereinafter, the color filters 154 are identified by letters attached to the color filters 154, respectively. "R", "G", and "B" represent the color filters that allow transmission of red light, green light, and blue light, respectively. FIG. 3 illustrates an example of the pixel 100 in which the color filters 154 that allow transmission of red light and green light, respectively, are each arranged. Hereinafter, the pixels 100 in which the color filters that allow transmission of red light, green light, and blue light, respectively, are each arranged are referred to as a red pixel 100, a green pixel 100, and a blue pixel 100, respectively.

The light-shielding film 153 blocks light transmitted through the color filter 154 of an adjacent pixel 100. The light-shielding film 153 is arranged in a region below the color filter 154, the region corresponding to a boundary between the pixels 100, and prevents light from being incident on the photoelectric conversion section 101, the light being obliquely incident on the pixel 100 and transmitted through the color filter 154 that is different from the color filter 154 arranged in the pixel including the corresponding photoelectric conversion section 101. Therefore, it is possible to prevent color mixing from occurring.

The planarizing film 152 is a film that planarizes a surface on which the color filter 154 is formed. The insulating film 151 is a film that insulates a front surface of the semiconductor substrate 141.

Note that the image capturing element 1 in FIG. 3 is a back-illuminated image capturing element, and thus the color filter 154 and the on-chip lens 155 are formed on a back surface of the semiconductor substrate 141. Therefore, a lower surface of the semiconductor substrate 141 in FIG. 3 is the front surface of the semiconductor substrate 141.

The semiconductor substrate 141 is a substrate in which a diffusion region for the photoelectric conversion section 101 and elements forming the pixel circuit of the pixel 100 is formed. Examples of the semiconductor substrate 141 can include a semiconductor substrate formed by using silicon (Si). Furthermore, a predetermined conductive type well region is formed in the semiconductor substrate 141, and a diffusion region for the photoelectric conversion section 101 or the like is formed in the well region. For convenience, it is assumed that the semiconductor substrate 141 in FIG. 3 has a P-type well region. In addition to the photoelectric conversion section 101, the MOS transistor 103 and the charge holding section 102 of the pixel circuit are illustrated in the semiconductor substrate 141 in FIG. 3. Furthermore, a separating section 142 for separating adjacent pixels 100 is arranged in the semiconductor substrate 141.

The photoelectric conversion section 101 is configured with an N-type semiconductor region 143 and a P-type well region (semiconductor substrate 141) around the N-type semiconductor region 143. Once incident light is radiated to a P-N junction between the N-type semiconductor region 143 and the P-type well region, photoelectric conversion occurs and charges are generated. Among the generated charges, electrons are accumulated in the N-type semiconductor region 143.

The charge holding section 102 is configured with an N-type semiconductor region 144. The charge accumulated in the N-type semiconductor region 143 of the photoelectric conversion section 101 is transferred and held in the N-type semiconductor region 144. Since the N-type semiconductor region 144 is configured such that the N-type semiconductor region 144 has a higher impurity concentration as compared with the N-type semiconductor region 143, a deep potential can be formed, and the charge accumulated in the N-type semiconductor region 144 can be completely transferred.

The MOS transistor 103 is a MOS transistor having the N-type semiconductor region 143 and the N-type semiconductor region 144 as a source and a drain, respectively, and having the P-type well region (semiconductor substrate 141) between the N-type semiconductor region 143 and the N-type semiconductor region 144 as a channel region. Furthermore, the gate of the MOS transistor 103 corresponds to a gate 145 arranged in the insulating layer 121. The gate 145 can be formed by using polycrystalline silicon formed on an upper layer portion of the above-mentioned channel region. Note that a gate oxidation film formed on the front surface of the semiconductor substrate 141 is arranged as the insulating layer 121 between the gate 145 and the channel region.

The wiring layers 123 to 125 perform transmission of an image signal generated by the pixel 100. Furthermore, the wiring layers 123 to 125 further perform transmission of a signal applied to the pixel circuit.

Specifically, the wiring layers 123 to 125 form the signal lines (the output signal line OUT, the transfer signal line TR, the reset signal line RST, and the selection signal line SEL) and the power supply line Vdd described with reference to FIG. 2. The wiring layers 123 to 125 and the pixel circuit are connected through a via plug 122. Furthermore, in FIG. 3, wiring of three layers, the wiring layers 123 to 125, is formed, and the respective wiring layers are also connected to each other through the via plug 122. As described above, the via plug 122 performs transmission of an image signal and a signal applied to the pixel circuit, similarly to the wiring layers 123 to 125. Note that a configuration of the wiring layer is not limited to the example described above. For example, two or four or more wiring layers can be used. The wiring layers 123 to 125 can be formed by using, for example, a metal such as aluminum (Al), copper (Cu), or the like. The via plug 122 can be formed by using, for example, a metal such as tungsten (W), Cu, or the like. Note that the via plug 122 is an example of a wiring layer described in the claims.

The insulating layer 121 insulates the wiring layers 123 to 125 from one another. Examples of the insulating layer 121 can include an oxide film such as a silicon oxide ($SiO_2$) film, or the like.

The support substrate 110 is a substrate that reinforces and supports the semiconductor substrate 141 and the like in a process of producing the image capturing element 1. The support substrate 110 is formed by using a semiconductor, and adheres to a surface of the insulating layer 121 to support the semiconductor substrate 141 and the like.

The polarization section 130 allows transmission of light in a specific polarization direction. Examples of the polarization section 130 can include a polarization section configured with a wire grid. Here, the polarization section configured with the wire grid is a polarization section configured with a plurality of lines arranged at a pitch smaller than a wavelength of the incident light. The plurality of lines are formed by using a material having a property of absorbing or reflecting light, and block light. Hereinafter, the line of the polarization section 130 is referred to as a light-shielding line (light-shielding line 139). The light-shielding line 139 can be formed by using a conductive inorganic material. For example, the light-shielding line 139 can be formed by using a metal material such as Al, silver (Ag), gold (Au), Cu, platinum (Pt), molybdenum (Mo), chromium (Cr), titanium (Ti), nickel (Ni), W, iron (Fe), tellurium (Te), or the like. Furthermore, for example, the light-shielding line 139 can also be formed by using an alloy of these metals and a semiconductor material such as silicon (Si), germanium (Ge), or the like. Furthermore, an adhesive layer for improving a strength of adhesion to the insulating layer 121 can be arranged on a lower layer of the light-shielding line 139. Examples of the adhesive layer can include a Ti film, a titanium nitride (TiN) film, and a film in which Ti and TiN are stacked.

Furthermore, the light-shielding line 139 can have a width of, for example, 30 to 100 nm. The polarization section 130 can be formed by arranging the light-shielding lines 139 at a pitch of, for example, 120 to 400 nm. Furthermore, an insulator that allows transmission of light, for example, an oxide such as $SiO_2$ or the like, a nitride such as silicon nitride (SiN) or the like, and air can be arranged in a region between the light-shielding lines 139. In FIG. 3, an example in which the insulating layer 121 is arranged between the light-shielding lines 139 is illustrated.

As a plurality of light-shielding lines 139 is arranged at a pitch smaller than a wavelength of incident light, light (light in a polarization direction parallel to the light-shielding lines 139) in a polarization direction perpendicular to a direction in which the plurality of light-shielding lines 139 are arranged can be attenuated. This is because a reflected wave generated by vibration of free electrons in the light-shielding line 139 according to an electric field of the incident light cancels the incident light. On the other hand, light (light in a polarization direction perpendicular to the light-shielding lines 139) in a polarization direction parallel to the direction in which the plurality of light-shielding lines 139 are arranged passes through the polarization section 130 without being attenuated. As such, the polarization section 130 can allow transmission of light in a specific polarization direction. Details of the configuration of the polarization section 130 will be described later.

The polarization section 130 is arranged between the semiconductor substrate 141 and the wiring layers 123 to 125, and light transmitted through the photoelectric conversion section 101 among incident light on the pixel 100 is incident on the polarization section 130. The polarization section 130 allows transmission of light in a specific polarization direction among the incident light. In a case where the light transmitted through the polarization section 130 is reflected by the wiring layers 123 to 125, is incident on adjacent pixels 100, and reaches the photoelectric conversion section 101, color mixing occurs. This is because light transmitted through the color filter 154 corresponding to light different from that of the color filter 154 arranged in the pixel including the corresponding photoelectric conversion section 101 is subjected to photoelectrical conversion. However, as adjacent polarization sections 130 are configured to implement different polarization directions, respectively, it is possible to prevent the light reflected by the wiring layers 123 to 125 from being incident on the photoelectric conversion section 101.

An arrow in FIG. 3 represents this state, in which a solid line represents light transmitted through the photoelectric conversion section 101 of the pixel 100 and incident on the polarization section 130, and a dotted line represents light in a specific polarization direction that is transmitted through the polarization section 130. Light reflected by the wiring layer 125 after transmitted through the polarization section 130 (polarization section 130a) is blocked by an adjacent polarization section 130 (polarization section 130b) configured to implement a different polarization direction, and thus is prevented from being incident on a photoelectric conversion section 101 of an adjacent pixel 100. Therefore, it is possible to reduce occurrence of color mixing. Note that a part of light transmitted through the photoelectric conversion section 101 and incident on the polarization section 130 is reflected by the polarization section 130 and is incident on the photoelectric conversion section 101 of the corresponding pixel 100 again. This makes it possible to compensate for a decrease in sensitivity.

[Arrangement of Polarization Section]

Figure 4A:
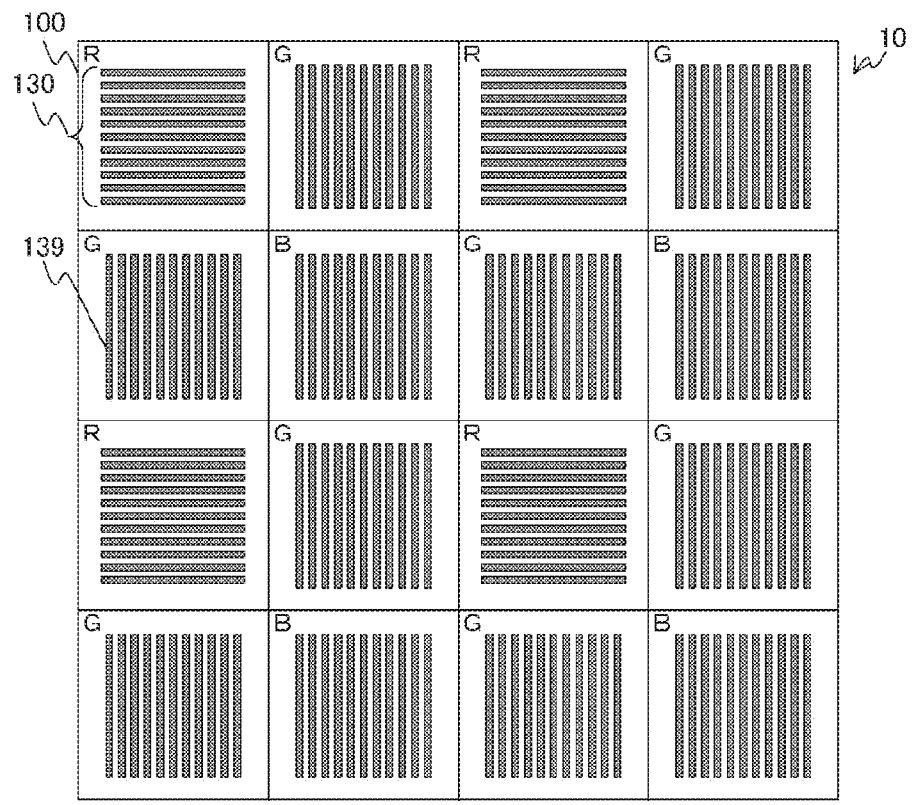
FIGS. 4A and 4B are views illustrating an example of arrangement of polarization sections according to the first embodiment of the present technology.
Figure 4B:
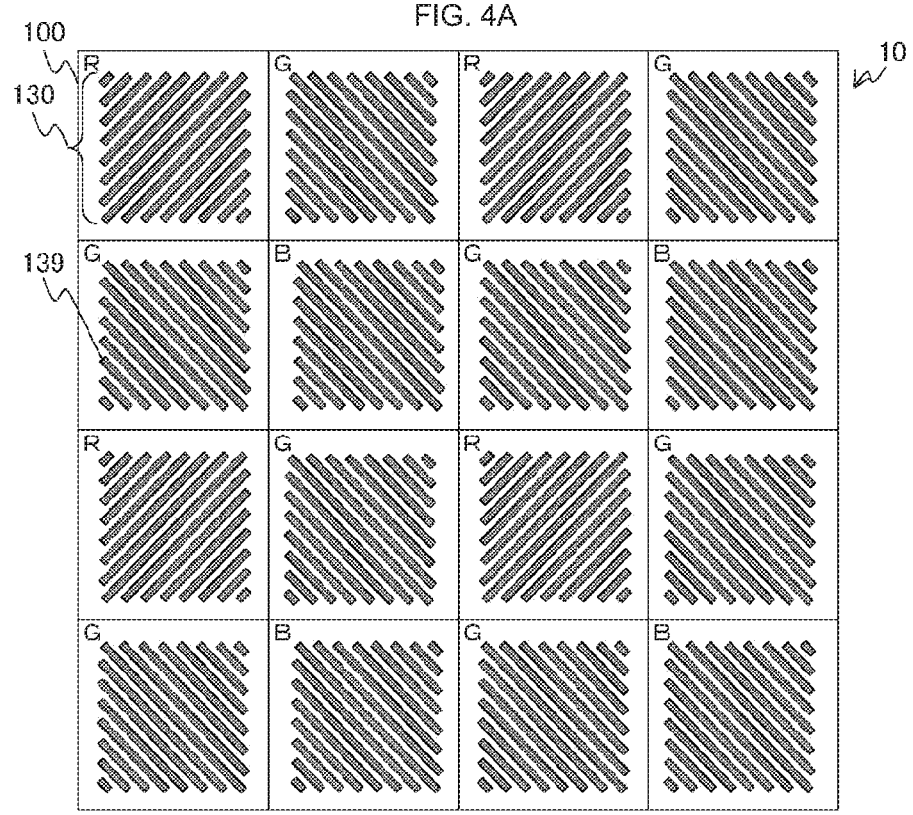

FIGS. 4A and 4B are views illustrating an example of arrangement of the polarization sections according to the first embodiment of the present technology. FIGS. 4A and 4B are views illustrating polarization directions of polarization sections 130 arranged in adjacent pixels 100 in the pixel array section 10. A rectangle in FIGS. 4A and 4B represents the pixel 100. Furthermore, a symbol described in the pixel 100 represents the type of the color filter 154 arranged in the pixel 100, similarly to FIG. 2. That is, the pixels 100 with "R", "G", and "B" correspond to red, green, and blue pixels, respectively. In FIGS. 4A and 4B, the pixel array section 10 in which arrangement of the red pixel 100, the green pixel 100, and the blue pixel 100 is a Bayer arrangement is illustrated as an example. Here, the Bayer arrangement is arrangement of pixels in which red pixels 100 and blue pixels 100 are arranged between green pixels 100 arranged in a checkered pattern.

In FIGS. 4A and 4B, FIG. 4A illustrates an example of the polarization section 130 configured with a wire grid (light-shielding lines 139) arranged in a vertical or horizontal direction. Polarized light in the horizontal direction is transmitted by light-shielding lines 139 arranged in the vertical direction, and polarized light in the vertical direction is transmitted by light-shielding lines 139 arranged in the horizontal direction. Furthermore, in FIG. 4A, a polarization section 130 configured with light-shielding lines 139 arranged in the vertical direction is arranged in the red pixel 100, and a polarization section 130 configured with light-shielding lines 139 arranged in the horizontal direction is arranged in each of the green pixel 100 and the blue pixel 100. That is, the polarization direction of the arranged polarization section 130 is different between the red pixel 100 and other pixels adjacent to the red pixel 100. Therefore, blocking of the light reflected by the wiring layers 123 to 125 described with reference to FIG. 3 is performed by the polarization section 130 in the red pixel 100, the green pixel 100, and the blue pixel 100 each having the polarization section 130 arranged therein. Furthermore, the polarization direction of the polarization section 130 arranged in the red pixel 100 and the polarization direction of the polarization section 130 arranged in another pixel 100 are different from each other by 90 degrees. An effect of blocking the reflected light can be improved as compared with a case of other angles by making the polarization directions of the adjacent polarization sections 130 orthogonal to each other as described above.

Red light, which has a longer wavelength than those of green light and blue light, has a low absorption rate for Si forming the photoelectric conversion section 101, and is likely to cause color mixing due to reflection by the wiring layers 123 to 125. Therefore, it is possible to prevent the color mixing by the red light and prevent the image quality from deteriorating due to the crosstalk by changing the polarization direction of the polarization section 130 arranged in each of the red pixel 100 and other pixels 100.

In FIGS. 4A and 4B, FIG. 4B illustrates an example in which a polarization section 130 configured with light-shielding lines 139 arranged in a right obliquely downward direction or a right obliquely upward direction is arranged. Also in FIG. 4B, a polarization direction of the arranged polarization section 130 is different between the red pixel 100 and other pixels adjacent to the red pixel 100 by 90 degrees.

[Configuration of Polarization Section]

Figure 5A:
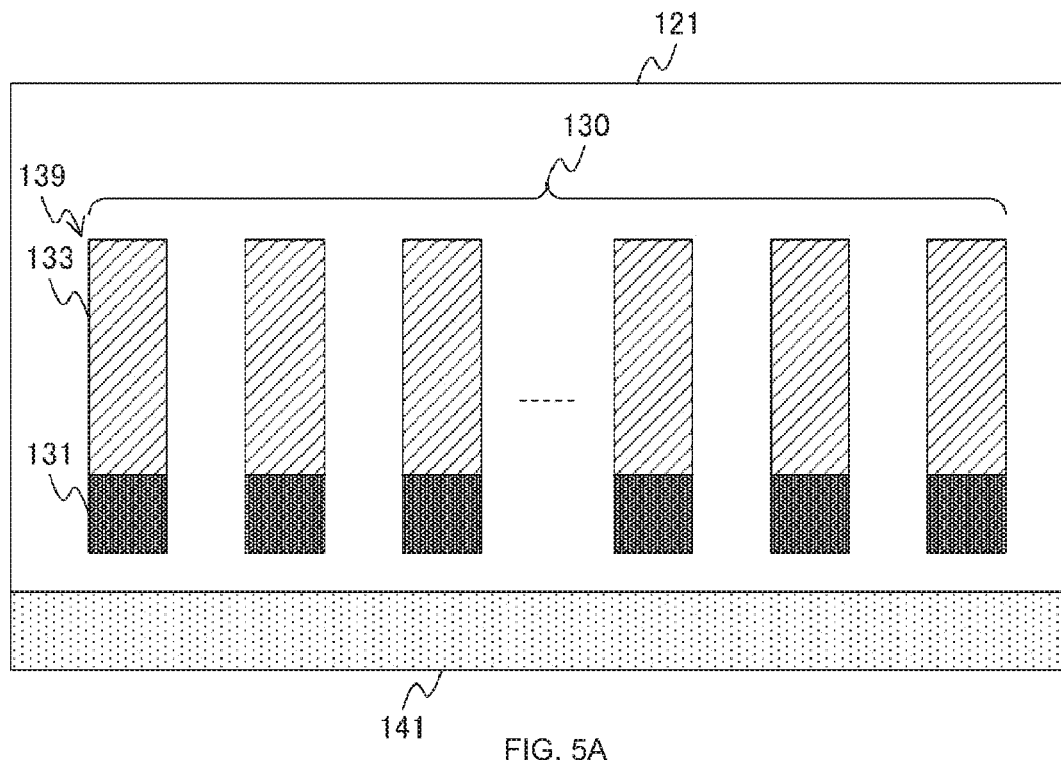
FIGS. 5A and 5B are views illustrating an example of a configuration of the polarization section according to the first embodiment of the present technology.
Figure 5B:
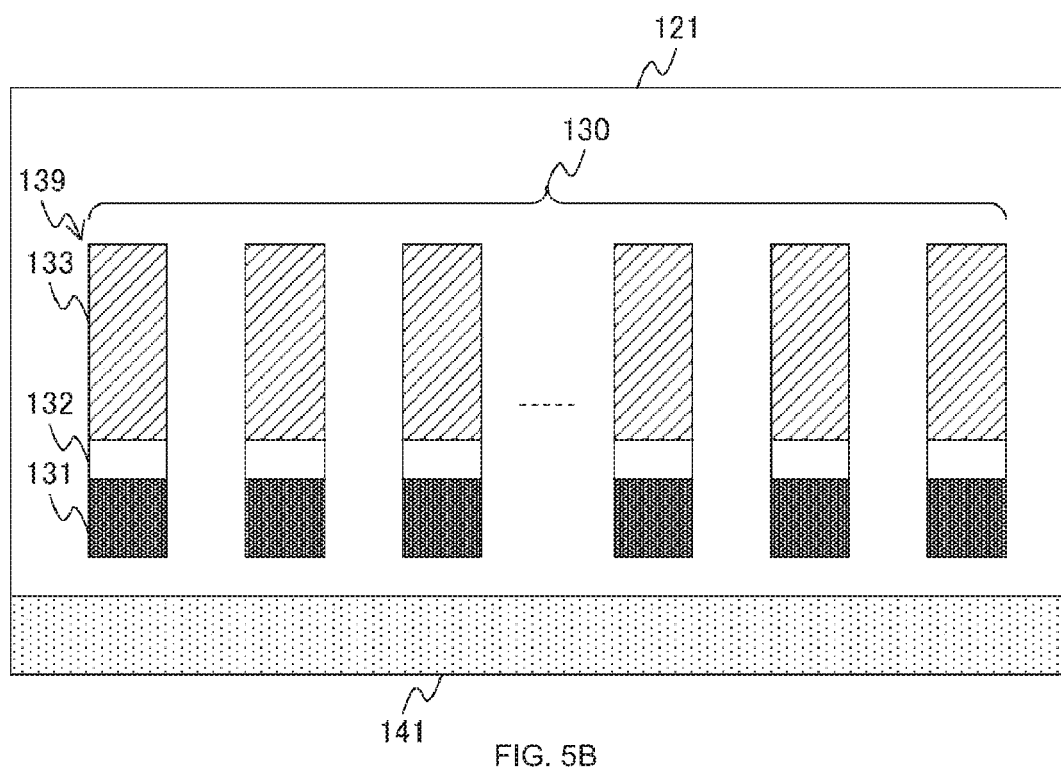

FIGS. 5A and 5B are views illustrating an example of a configuration of the polarization section according to the first embodiment of the present technology. FIGS. 5A and 5B are cross-sectional views illustrating an example of a configuration of the polarization section 130, and is a cross-sectional view illustrating a configuration of the light-shielding line 139. Furthermore, FIGS. 5A and 5B illustrate an example of the light-shielding line 139 formed in two or three layers, unlike the light-shielding line 139 described with reference to FIG. 3.

In FIG. 5A, the light-shielding line 139 includes a light absorbing layer 131 and a light reflecting layer 133 that are sequentially stacked. The light reflecting layer 133 reflects light. The light reflecting layer 133 can be formed by using a conductive inorganic material, similarly to the light-shielding line 139 described with reference to FIG. 3. For example, the light reflecting layer 133 can be formed by using Al. The light absorbing layer 131 absorbs light. The light absorbing layer 131 can be formed by using a metal material, an alloy material, and a semiconductor material exhibiting a light absorbing effect. A material similar to that of the light reflecting layer 133 can be used for the light reflecting layer 131, but it is necessary to select a material that exhibits an effect of absorbing light having a desired wavelength. For example, the light absorbing layer 131 can be formed by using W. Note that the adhesive layer described with reference to FIG. 3 can also be used as the light absorbing layer 131. Reflection of light from the polarization section 130 can be reduced by arranging the light absorbing layer 131.

The light-shielding line 139 in FIG. 5B is different from the light-shielding line 139 in FIG. 5A in that an insulating layer 132 is provided between the light absorbing layer 131 and the light reflecting layer 133. The insulating layer 132 is a transparent insulator and adjusts a phase of light reflected by the light reflecting layer 133. The phase adjustment performed by the insulating layer 132 can be performed by making the phase of the light reflected by the light reflecting layer 133 opposite to a phase of light reflected by the light absorbing layer 131. Since the light of which the phase has been adjusted by the insulating layer 132 and the light reflected by the light absorbing layer 131 have opposite phases, both are attenuated by interference. Therefore, the reflection of light by the light-shielding line 139 can be further reduced. Furthermore, the insulating layer 132 also serves as a base of the light reflecting layer 133. The insulating layer 132 can be formed by using, for example, SiO2.

The polarization section 130 can be formed as follows. First, an oxide film to be a material of the insulating layer 121 is formed on the front surface of the semiconductor substrate 141. Next, a metal film to be a material of the light-shielding line 139 is formed. Next, the metal film is etched to form the light-shielding line 139. Next, an oxide film is stacked. By doing so, the polarization section 130 can be formed. Thereafter, the wiring layers 123 to 125 and the insulating layer 121 are sequentially formed.

Modified Example 1

In the above-described image capturing element 1, the color filters 154 corresponding to red light, green light, and blue light, respectively, are arranged in the pixel 100. However, the image capturing element 1 can further include a pixel 100 in which a color filter corresponding to white light is arranged or a pixel 100 in which a color filter corresponding to infrared light is arranged.

Figure 6A:
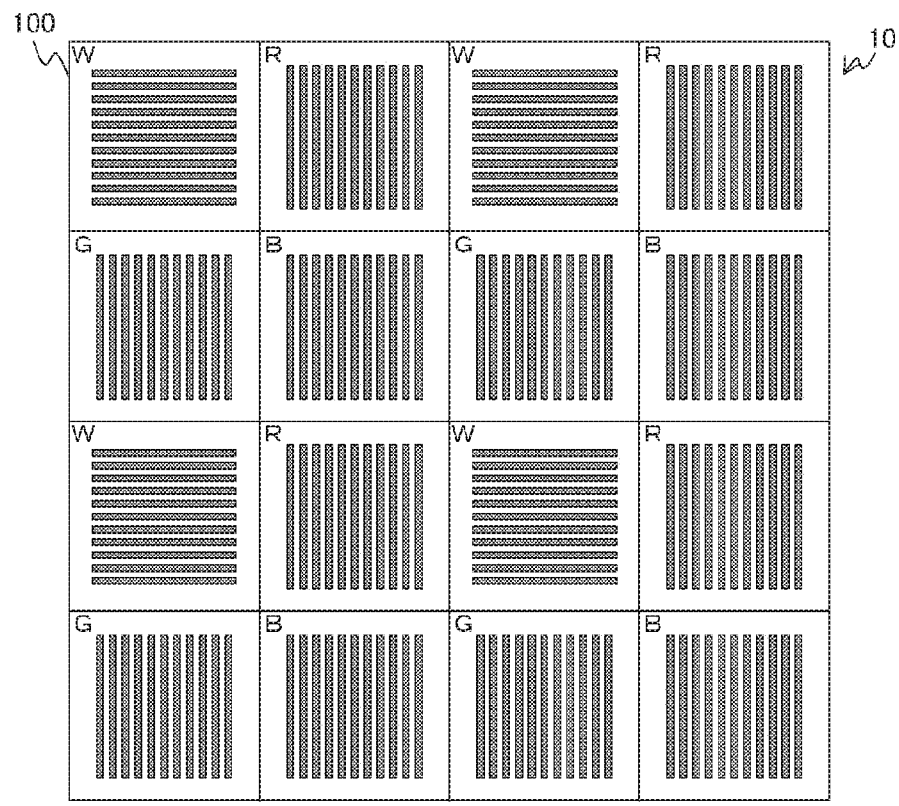
FIGS. 6A and 6B are views illustrating an example of arrangement of polarization sections according to a first modified example of the first embodiment of the present technology.
Figure 6B:
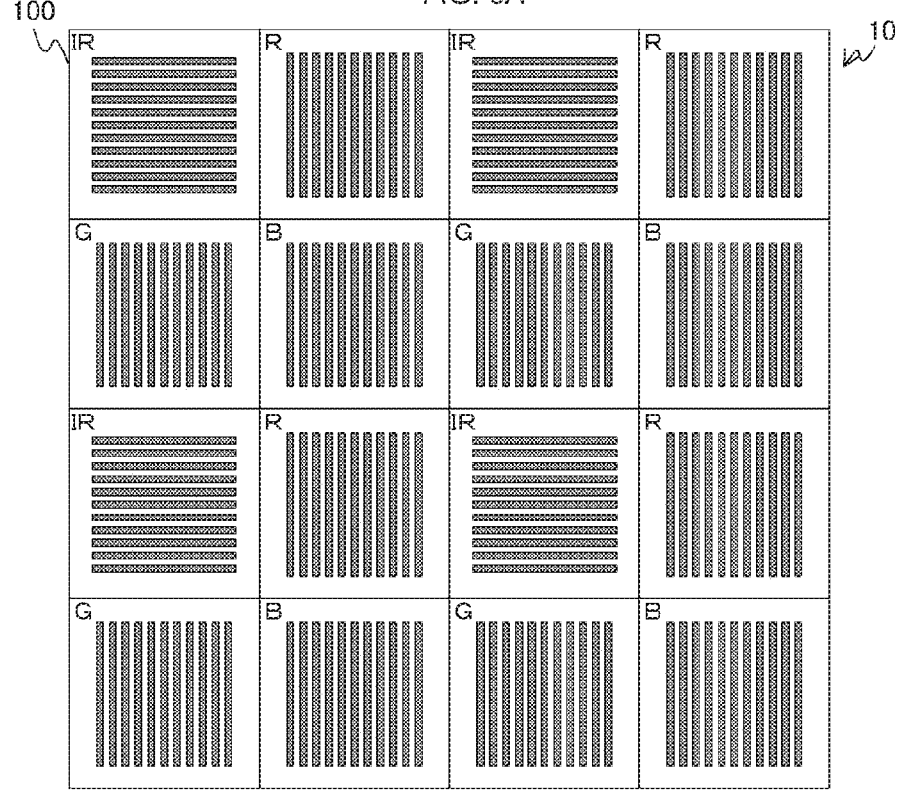

FIGS. 6A and 6B are views illustrating an example of arrangement of polarization sections according to a first modified example of the first embodiment of the present technology. FIGS. 6A and 6B are views illustrating polarization directions of polarization sections 130 arranged in adjacent pixels 100 in a pixel array section 10, similarly to FIGS. 4A and 4B. The pixel array section 10 described in FIG. 6A is different from the pixel array section 10 described with reference to FIGS. 4A and 4B in that the pixel array section 10 in FIG. 6A further includes a white pixel 100 that is a pixel 100 in which a color filter 154 corresponding to white light is arranged. Here, the color filter 154 corresponding to white light is a color filter that allows transmission of red light, green light, and blue light. Therefore, an image signal generated by the white pixel 100 can be used as a luminance signal that is information regarding a luminance of a subject. In FIGS. 6A and 6B, "W" represents the color filter corresponding to white light. Furthermore, the pixel array section 10 in FIGS. 6A and 6B can have a configuration in which the white pixel 100 replaces one of two green pixels 100 in the Bayer arrangement.

The pixel array section 10 described in FIG. 6B is different from the pixel array section 10 described with reference to FIGS. 4A and 4B in that the pixel array section 10 in FIG. 6B further includes an infrared pixel 100 that is a pixel 100 in which a color filter 154 corresponding to infrared light is arranged. Here, the color filter 154 corresponding to the infrared light is a color filter that allows transmission of the infrared light. Therefore, the infrared light pixel 100 generates an infrared light image signal that is information regarding infrared light from the subject. The image capturing element 1 in which the infrared light pixel 100 is arranged can be used as, for example, an image capturing element that performs image capturing while radiating infrared light in a low illuminance environment. In FIGS. 6A and 6B, "IR" represents the color filter corresponding to infrared light.

The white light is light including red light. Furthermore, the infrared light is light having a longer wavelength than that of red light. Therefore, in each of the white pixel 100 and the infrared light pixel 100, a polarization section 130 with a polarization direction that is different from that of a polarization section 130 arranged in each of other pixels 100 is arranged. As a result, it is possible to prevent the occurrence of color mixing.

Modified Example 2

In the above-described image capturing element 1, in the red pixel 100, the polarization section 130 with a polarization direction that is different from that of the polarization section 130 arranged in the pixel 100 adjacent to the red pixel 100 is arranged. However, also in the pixel 100 corresponding to another color, the polarization section 130 with a polarization direction that is different from that of the polarization section 130 arranged in the pixel 100 adjacent thereto may be arranged.

Figure 7A:
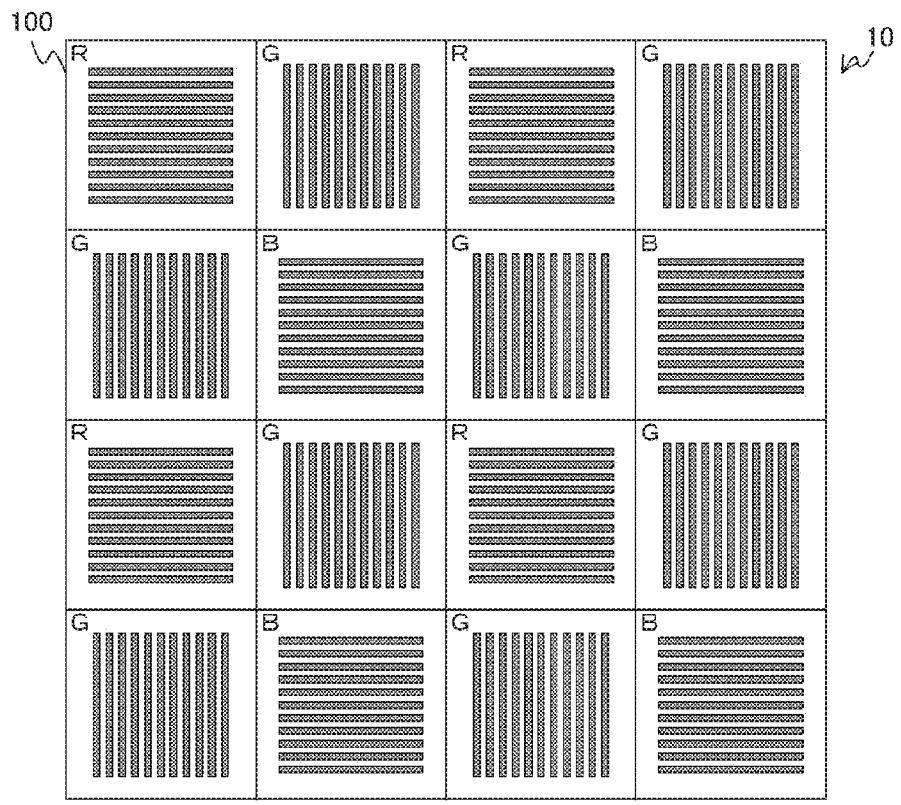
FIGS. 7A and 7B are views illustrating an example of arrangement of polarization sections according to a second modified example of the first embodiment of the present technology.
Figure 7B:
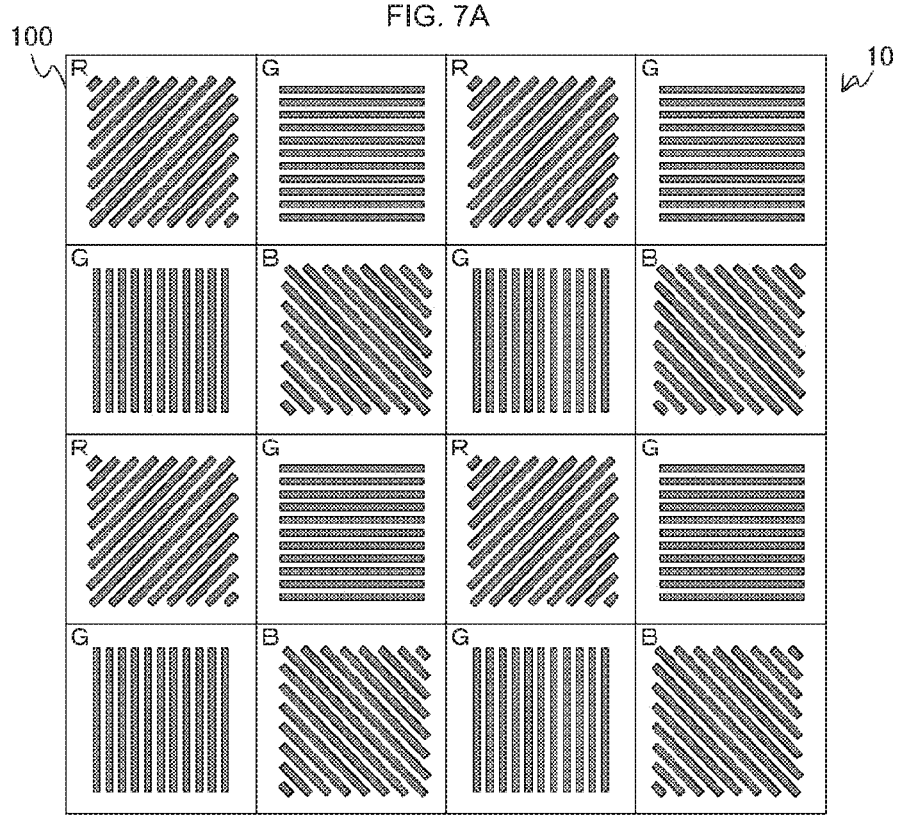

FIGS. 7A and 7B are views illustrating an example of arrangement of polarization sections according to a second modified example of the first embodiment of the present technology. FIGS. 6A and 6B are views illustrating polarization directions of polarization sections 130 arranged in adjacent pixels 100 in a pixel array section 10, similarly to FIGS. 4A and 4B. In FIG. 7A, the pixel array section 10 in which polarization sections 130 each of which a polarization direction is orthogonal to that of a polarization section 130 of each adjacent pixel 100 in the vertical direction or the horizontal direction are arranged is illustrated as an example. Therefore, in the pixel array section 10 illustrated in FIG. 7A, it is possible to prevent the occurrence of color mixing in the vertically and horizontally adjacent pixels 100.

The pixel array section 10 in FIG. 7B illustrates an example in which polarization sections 130 each of which a polarization direction is different from that of a polarization section 130 of each adjacent pixel 100 in the vertical direction or the horizontal direction by 45 degrees are arranged. Furthermore, polarization sections 130 of two vertically adjacent pixels 100 and polarization sections 130 of two horizontally adjacent pixels 100 are arranged so that polarization directions thereof are different from each other by 90 degrees. Therefore, in the pixel array section 10 illustrated in FIG. 7B, it is possible to prevent the occurrence of color mixing in pixels 100 that are adjacent vertically, horizontally, and diagonally.

As described above, in the image capturing element 1 according to the second modified example of the first embodiment of the present technology, a polarization section 130 with a polarization direction that is different from that of a polarization section 130 of the adjacent pixel 100 is arranged in each of the red pixel 100, the green pixel 100, and the blue pixel 100. Accordingly, it is possible to prevent the occurrence of color mixing in the red pixel 100, the green pixel 100, and the blue pixel 100.

Note that the configuration of the image capturing element 1 according to the second modified example of the first embodiment of the present technology is not limited to the above-described example. For example, a pixel 100 including a color filter 154 corresponding to a complementary color such as cyan, magenta, yellow, or the like may be arranged. Furthermore, a pixel 100 with no color filter 154 can be arranged. In this case, the image capturing element 1 outputs a monochrome image signal. The occurrence of crosstalk can be reduced, and a decrease in resolution can be suppressed.

As described above, in the image capturing element 1 according to the first embodiment of the present technology, the polarization section 130 is arranged between the semiconductor substrate 141 and the wiring layer 123 and the like. With this configuration, it is possible to prevent incident light reflected by the wiring layer 123 and the like after transmitted through the photoelectric conversion section 101 of the semiconductor substrate 141 from being incident on a photoelectric conversion section 101 of an adjacent pixel 100. Therefore, the occurrence of crosstalk can be reduced, and deterioration in image quality can be prevented.

2. Second Embodiment

In the image capturing element 1 according to the first embodiment described above, the polarization section 130 is arranged between the first wiring layer 123 and the semiconductor substrate 141. On the other hand, an image capturing element 1 according to a second embodiment of the present technology is different from that of the first embodiment in that a polarization section 130 is arranged on the same level as that of a wiring layer 123.

[Configuration of Pixel]

Figure 8:
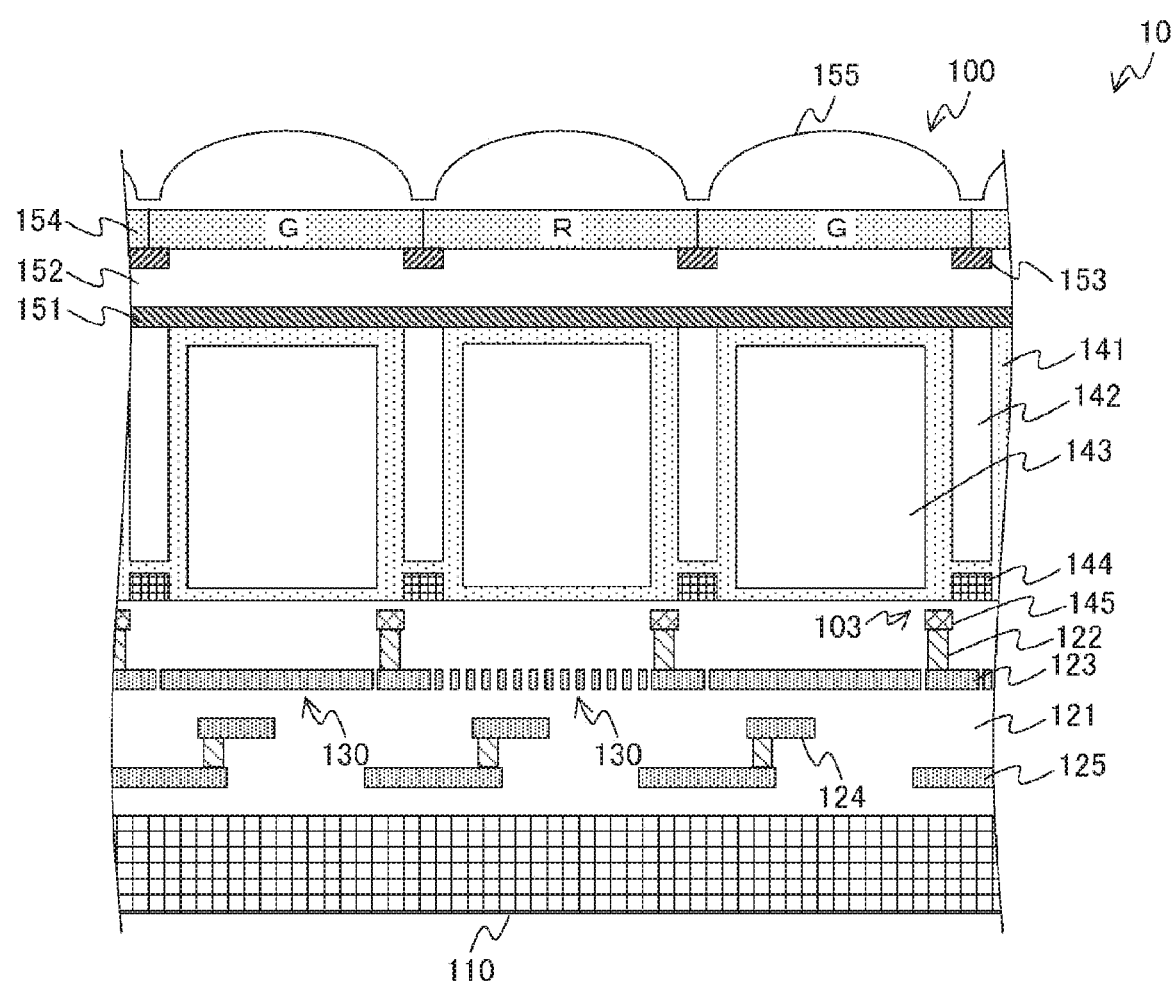
FIG. 8 is a view illustrating an example of a configuration of a pixel according to a second embodiment of the present technology.

FIG. 8 is a view illustrating an example of a configuration of a pixel according to the second embodiment of the present technology. FIG. 3 is a schematic cross-sectional view illustrating an example of a configuration of a pixel 100 arranged in the pixel array section 10. The pixel 100 in FIG. 8 is different from the pixel 100 described with reference to FIG. 3 in that the polarization section 130 is arranged on the same level as that of the wiring layer 123. The polarization section 130 in FIG. 8 is arranged between wiring layers 124 and 125 and a semiconductor substrate 141, and can be formed simultaneously with the wiring layer 123.

[Configuration of Polarization Section]

Figure 9:
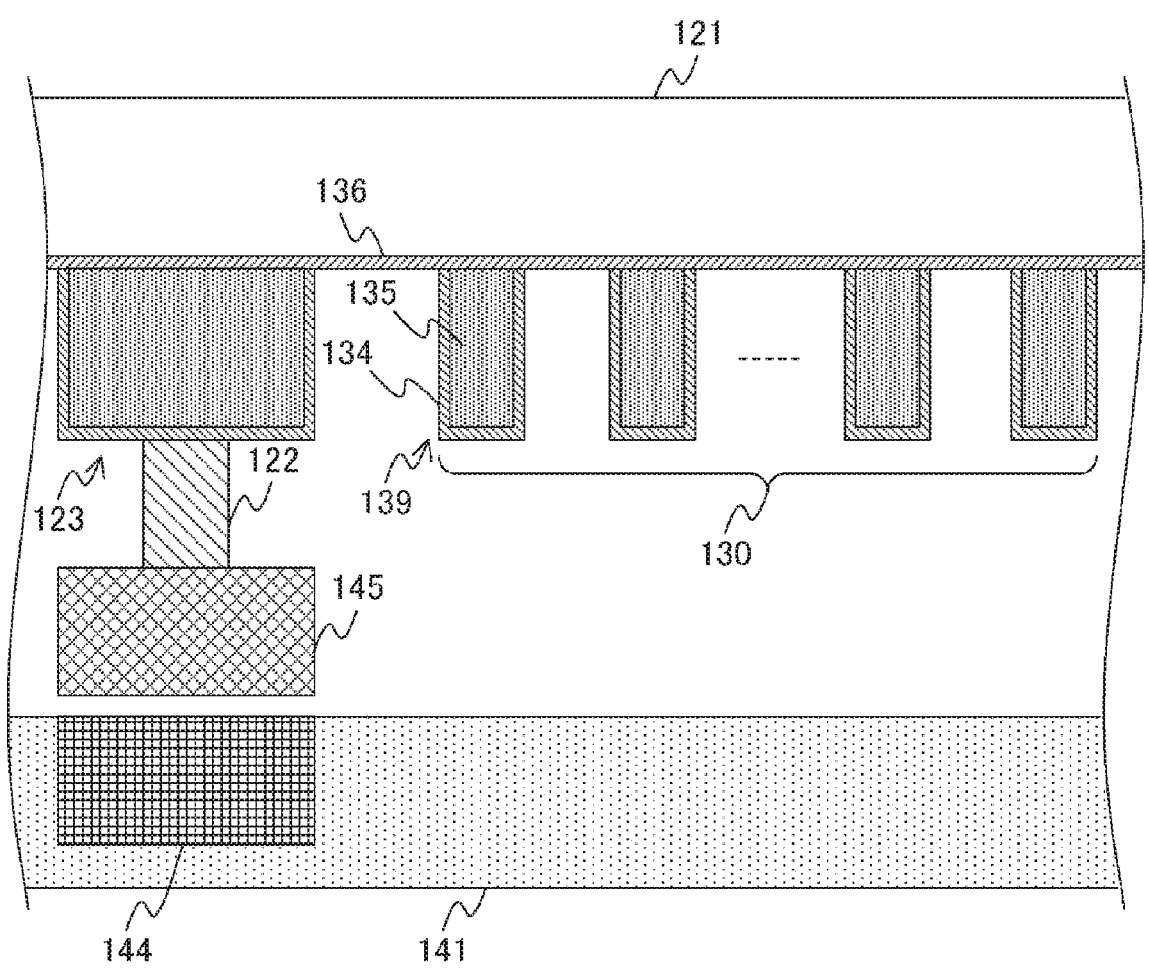
FIG. 9 is a view illustrating an example of a configuration of the polarization section according to the second embodiment of the present technology.

FIG. 9 is a view illustrating an example of a configuration of the polarization section according to the second embodiment of the present technology. FIGS. 5A and 5B are cross-sectional views illustrating an example of a configuration of the polarization section 130, and is a cross-sectional view illustrating a configuration of the light-shielding line 139. Furthermore, FIG. 9 is a view illustrating a polarization section 130 near the wiring layer 123 connected to a gate 145 of a MOS transistor 103 in FIG. 8. As described above, the polarization section 130 in FIG. 9 is formed on the same level as that of the wiring layer 123. Therefore, the light-shielding line 139 can have the same configuration as the wiring layer 123. Specifically, the light-shielding line 139 includes a metal barrier/plating seed layer 134 and a Cu wiring layer 135.

The Cu wiring layer 135 is a wiring formed by using Cu. The Cu wiring layer 135 can be formed by electroplating. The metal barrier/plating seed layer 134 is arranged under the Cu wiring layer 135, and includes a metal barrier layer for preventing diffusion of Cu from the Cu wiring layer 135, and a plating seed layer serving as a conductive film during the electroplating of the Cu wiring layer 135. The metal barrier layer can be formed by using, for example, Ta. Furthermore, the plating seed layer can be formed by using, for example, Cu. Note that the metal barrier layer/plating seed layer 134 can also be used as the light absorbing layer 131 described with reference to FIGS. 5A and 5B.

Note that an insulating film barrier layer 136 is arranged between insulating layers 121 including surfaces of the wiring layer 123 and the light-shielding line 139 in FIG. 9. The insulating film barrier layer 136 is a film formed to prevent diffusion of Cu from the Cu wiring layer 135 and block etching during etching of the insulating layer 121. The insulating film barrier layer 136 can be formed by using, for example, nitrogen-added silicon carbide (SiCN). Note that illustration of the insulating film barrier layer 136 is omitted in FIG. 3 and FIGS. 15, 16, and 18 as described later.

[Arrangement of Polarization Section]

Figure 10:
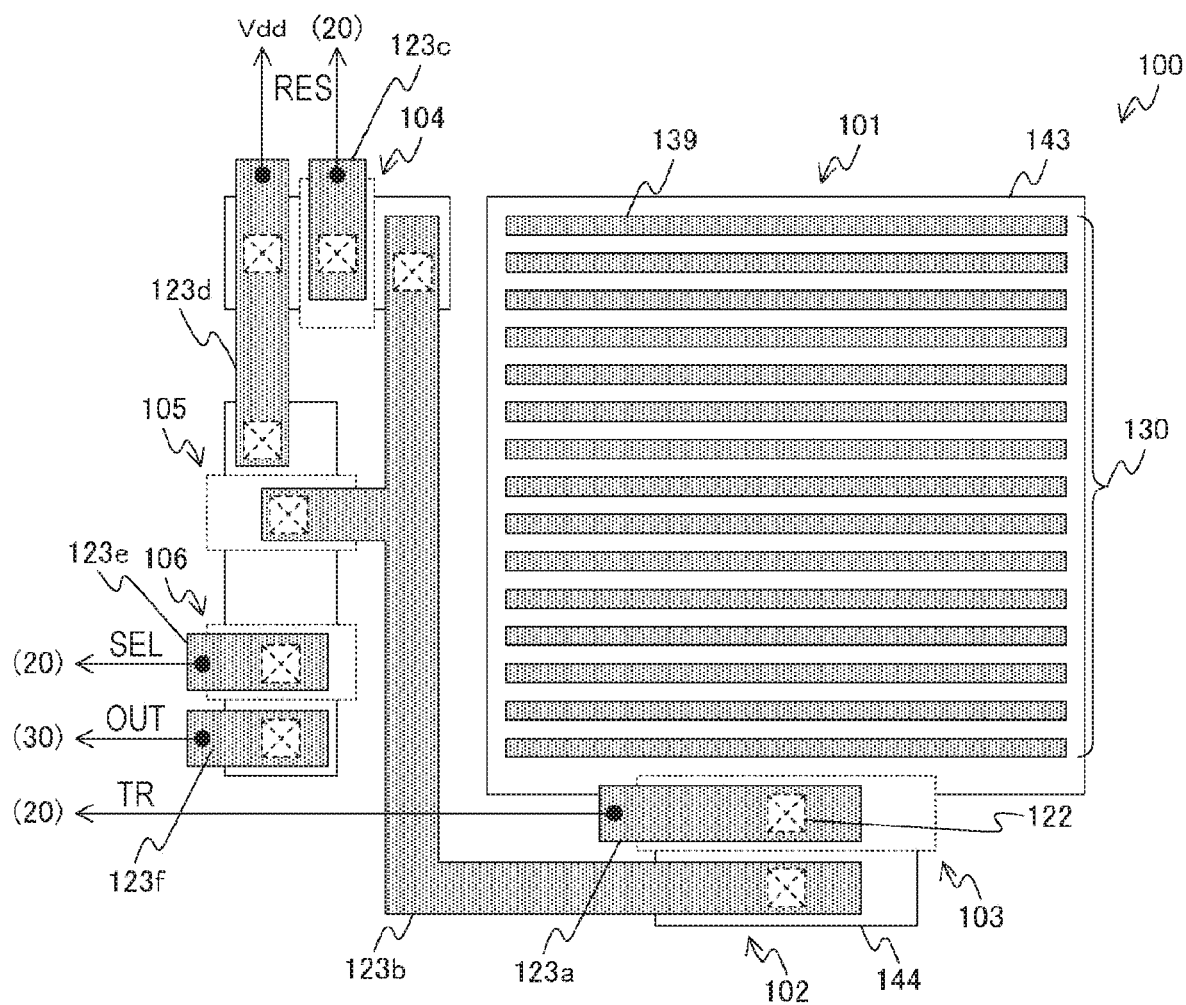
FIG. 10 is a view illustrating an example of arrangement of the polarization section according to the second embodiment of the present technology.

FIG. 10 is a view illustrating an example of arrangement of the polarization section according to the second embodiment of the present technology. FIG. 10 is a plan view illustrating arrangement of a diffusion layer of the semiconductor substrate 141 and the wiring layer 123 in the pixel 100, and is a plan view illustrating arrangement of the photoelectric conversion section 101 and the pixel circuit described with reference to FIG. 2. In FIG. 10, a solid rectangle represents an N-type semiconductor region of the semiconductor substrate 141. A dashed rectangle represents a gate of a MOS transistor. A hatched polygon represents the wiring layer 123. A dotted rectangle represents a via plug 122.

In FIG. 10, an N-type semiconductor region 143 of the photoelectric conversion section 101 is arranged in the upper right region of the pixel 100, and an N-type semiconductor region 144 is arranged below the N-type semiconductor region 143. As described above, the N-type semiconductor region 144 functions as the drain of the MOS transistor 103 and the charge holding section 102. On the left side of the N-type semiconductor region 143, MOS transistors 104 to 106 are arranged in order from the top in FIG. 10. Note that a source of the MOS transistor 105 and a drain of the MOS transistor 106 are formed by using the same N-type semiconductor region.

A wiring layer 123a connected to a gate of the MOS transistor 103 through the via plug 122 forms a signal line TR. Similarly, a wiring layer 123c connected to a gate of the MOS transistor 104 forms a signal line RES. A wiring layer 123d commonly connected to the N-type semiconductor region forming the drain of the MOS transistor 104 and the N-type semiconductor region forming the drain of the MOS transistor 105 forms a power supply line Vdd. A wiring layer 123e and a wiring layer 123f connected to the N-type semiconductor region forming a gate and a source of the MOS transistor 106 form a signal line SEL and a signal line OUT, respectively. Furthermore, the charge holding section 102 (N-type semiconductor region 144), the N-type semiconductor region forming a source of the MOS transistor 104, and a gate of the MOS transistor 105 are connected by the wiring layer 123b.

The polarization section 130 is arranged in an upper layer of the N-type semiconductor region 143. The light-shielding line 139 of the polarization section 130 can be formed in a manner similar to that of the wiring layer 123.

Figure 11:
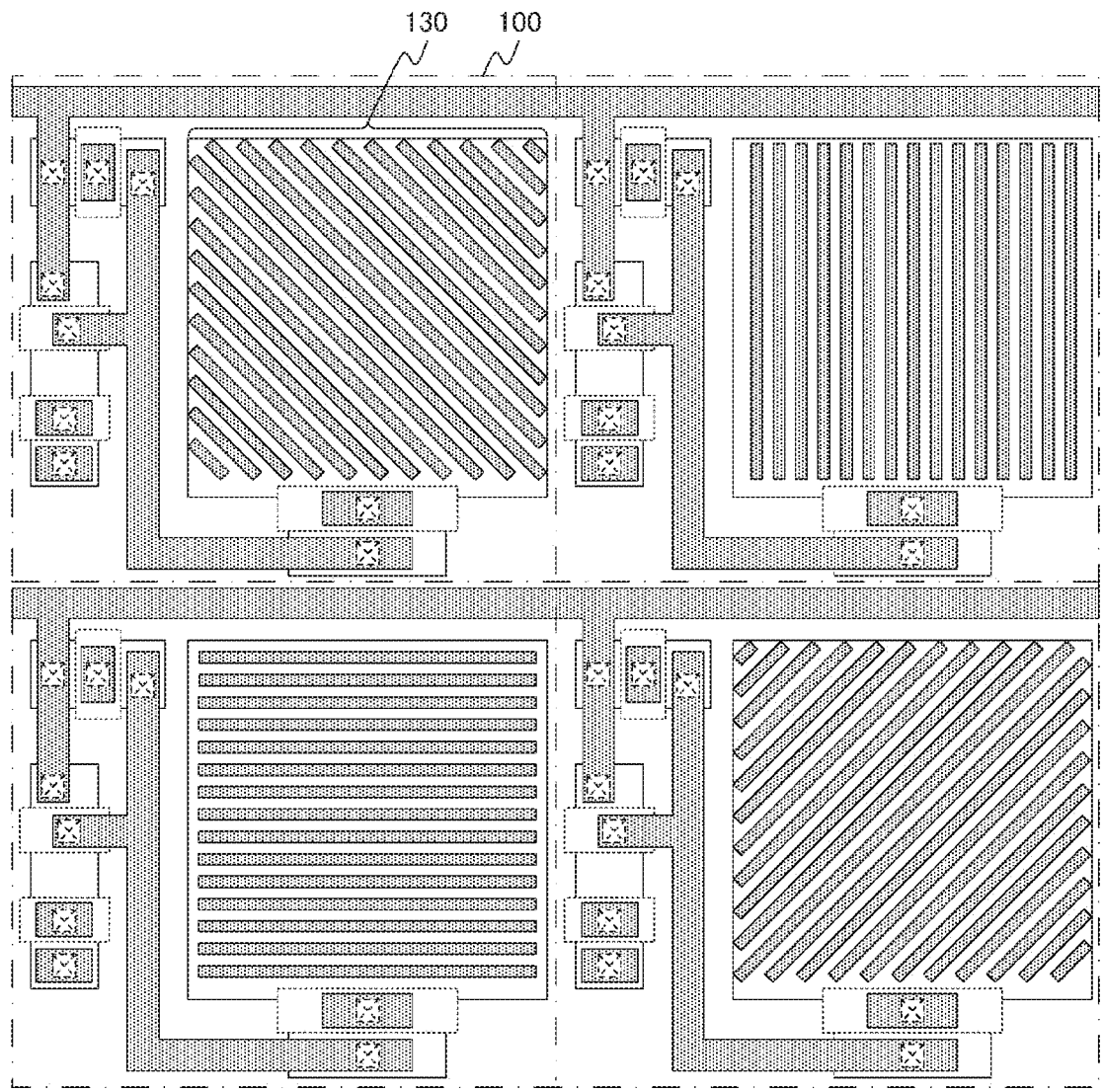
FIG. 11 is a view illustrating the example of the arrangement of the polarization section according to the second embodiment of the present technology.

FIG. 11 is a view illustrating an example of arrangement of the polarization section according to the second embodiment of the present technology. FIG. 11 is a plan view illustrating arrangement of the polarization section 130 in the pixel array section 10. As illustrated in FIG. 11, the polarization section 130 with a polarization direction that is different from that of a polarization section 130 of an adjacent pixel 100 can be arranged. Furthermore, FIG. 11 is a view illustrating a connection state of the wiring layer 123. All the signal lines of the pixel 100 are connected by multilayer wirings including the wiring layers 124 and 125. Note that the polarization section 130 in FIG. 11 employs a similar arrangement as that of the polarization section 130 described in FIG. 7B.

[Method of Producing Polarization Section]

Figure 12A:
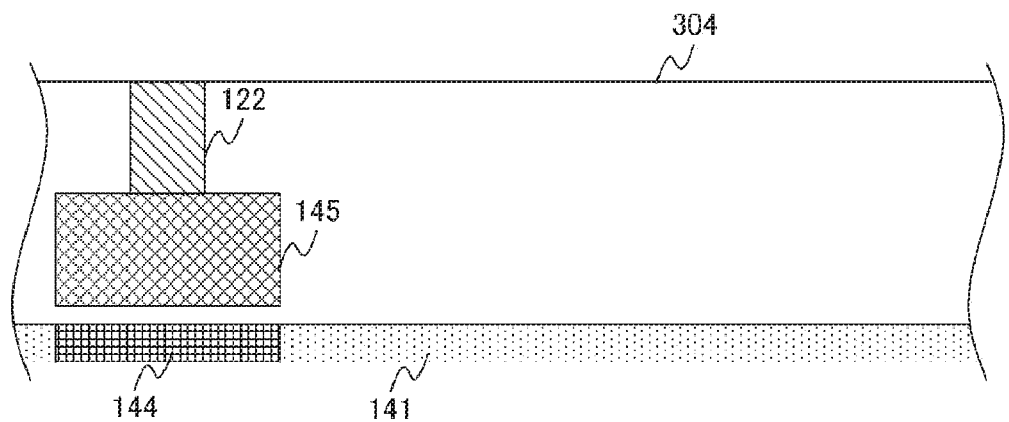
FIGS. 12A, 12B, and 12C are views illustrating an example of a method of producing the polarization section according to the second embodiment of the present technology.
Figure 12B:
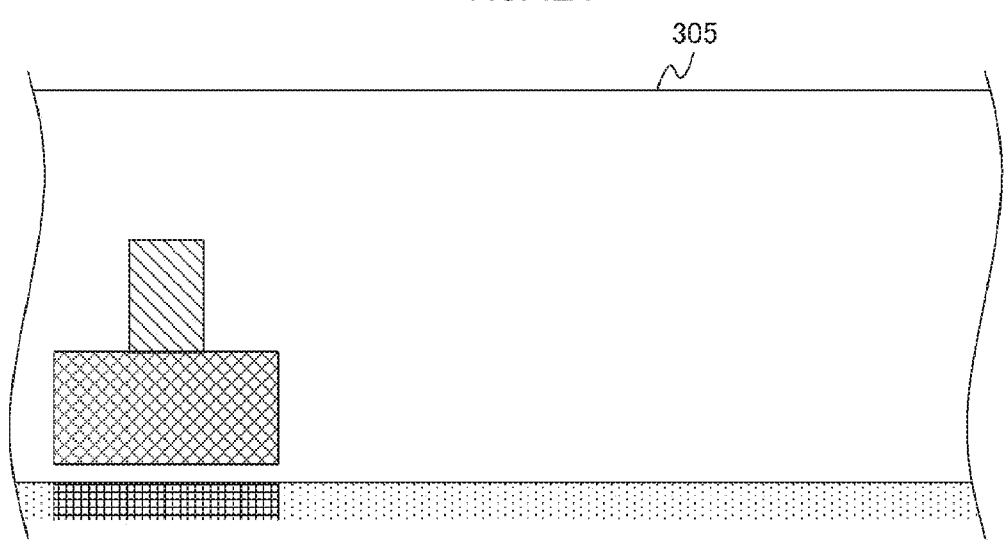
Figure 12C:
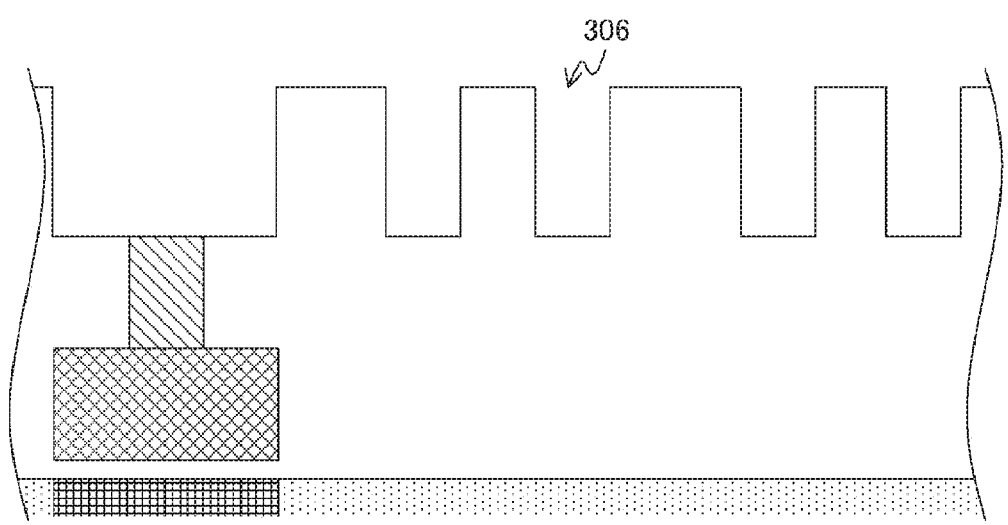

FIGS. 12A, 12B, 12C, 13A, 13B, and 13C each are views illustrating an example of a method of producing the polarization section according to the second embodiment of the present technology. FIGS. 12A, 12B, 12C, 13A, 13B, and 13C each are views illustrating a process of producing the polarization section 130. First, the via plug 122 is formed in an oxide film 304 that is a material of the insulating layer 121 in which the gate 145 and the like are arranged. A process of forming the via plug 122 will be described later with reference to FIGS. 17A, 17B, 7C, and 7D. Next, a surface of the insulating layer 121 is planarized. The surface can be planarized by, for example, chemical mechanical polishing (CMP) (FIG. 12A). Next, an oxide film 305 is stacked (FIG. 12B). Next, an opening portion 306 is formed by etching the oxide film 305 in a region where the wiring layer 123 and the light-shielding line 139 are to be formed (FIG. 12C).

Figure 13A:
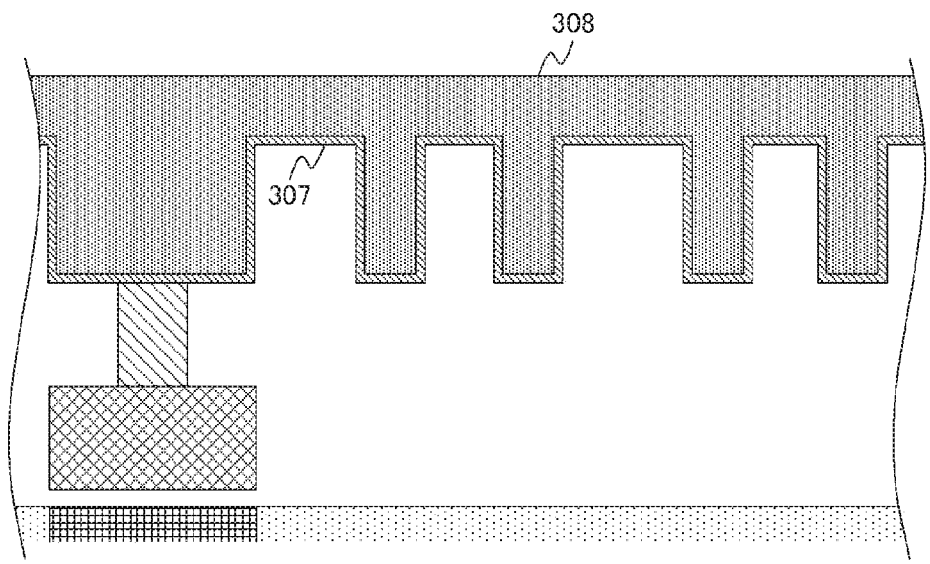
FIGS. 13A, 13B, and 13C are views illustrating the example of the method of producing the polarization section according to the second embodiment of the present technology.
Figure 13B:
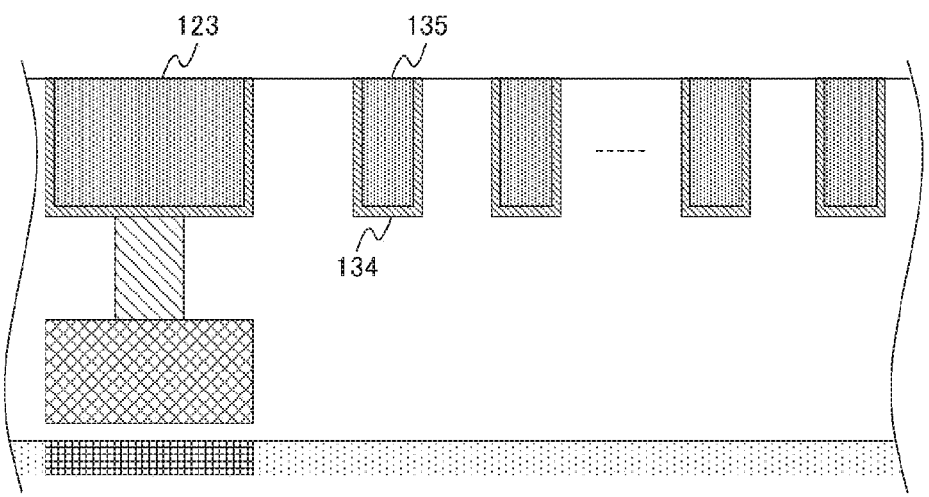
Figure 13C:
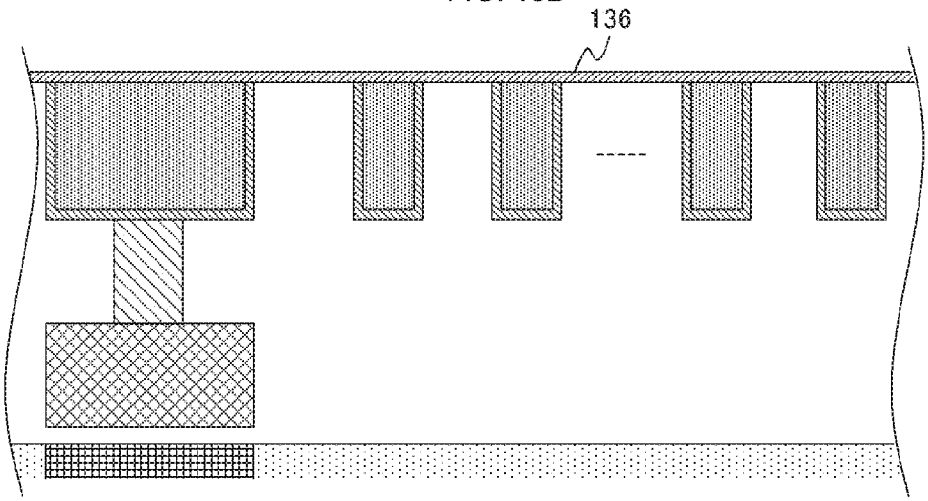

Next, a metal layer 307 is formed by sequentially stacking a metal barrier layer and a plating seed layer. The sequential stacking can be performed by, for example, sputtering or chemical vapor deposition (CVD). Next, a Cu layer 308 is formed by electroplating. Thereafter, heat treatment is performed (FIG. 13A). Next, the surface is ground by CMP to remove the metal layer 307 and the Cu layer 308 that are arranged in a region other than the opening portion 306 and perform planarization (FIG. 13B). As a result, the metal barrier/plating seed layer 134 and the Cu wiring layer 135 are formed. Thereafter, the insulating film barrier layer 136 is formed. This can be performed by CVD. As a result, the wiring layer 123 and the light-shielding line 139 can be formed at the same time.

Other configurations of the image capturing element 1 are similar to those of the image capturing element 1 described in the first embodiment of the present technology, and thus a description thereof will be omitted.

As described above, in the image capturing element 1 according to the second embodiment of the present technology, a process of producing the image capturing element 1 can be simplified by forming the polarization section 130 and the wiring layer 123 at the same time.

3. Third Embodiment

In the image capturing element 1 according to the second embodiment described above, the polarization section 130 and the wiring layer 123 are formed at the same time. On the other hand, an image capturing element 1 according to a third embodiment of the present technology is different from that of the second embodiment in that a polarization section 130 is used as a signal line.

[Configuration of Polarization Section]

Figure 14:
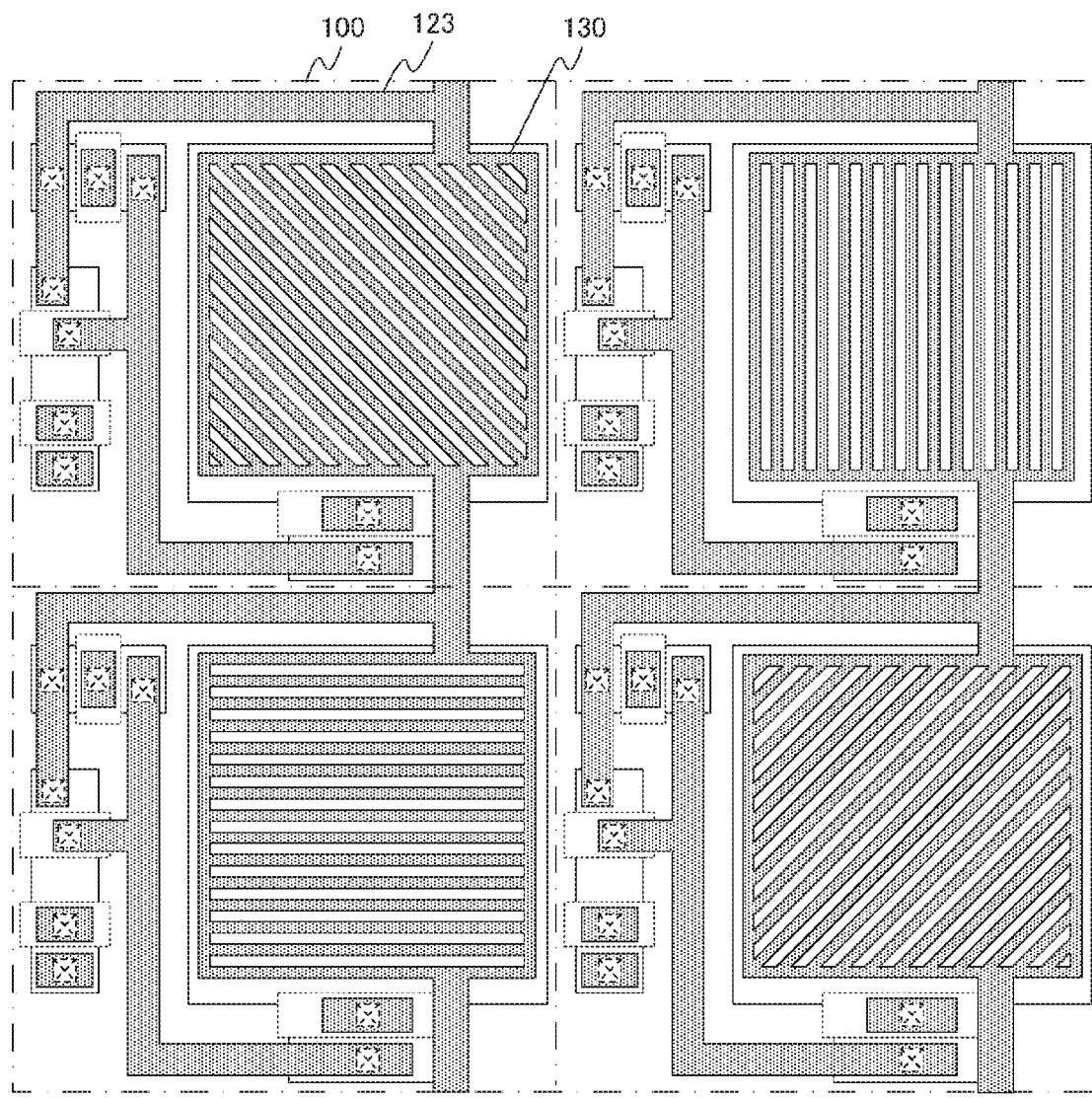
FIG. 14 is a view illustrating an example of a configuration of a polarization section according to a third embodiment of the present technology.

FIG. 14 is a view illustrating an example of a configuration of the polarization section according to the third embodiment of the present technology. FIG. 14 is a plan view illustrating arrangement of the polarization section 130 in a pixel array section 10, similarly to FIG. 11. The polarization section 130 in FIG. 14 functions as a wiring layer 123. Specifically, the polarization section 130 is used as a power supply line Vdd that supplies power to a pixel 100. As the polarization section 130 is used as the wiring layer 123, the impedance of the wiring can be reduced, and the loss can be reduced. Furthermore, since the wiring layer 123 can be arranged on an upper surface of a photoelectric conversion section 101, arrangement of the signal line can be simplified.

Other configurations of the image capturing element 1 are similar to those of the image capturing element 1 described in the second embodiment of the present technology, and thus a description thereof will be omitted.

As described above, in the image capturing element 1 according to the third embodiment of the present technology, the polarization section 130 is used as the wiring layer 123, and thus it is possible to reduce the impedance of the signal line of the pixel 100. Furthermore, the arrangement of the signal line in the pixel 100 can be simplified.

4. Fourth Embodiment

In the image capturing element 1 according to the second embodiment described above, the polarization section 130 and the wiring layer 123 are formed on the same level. On the other hand, an image capturing element 1 according to a fourth embodiment of the present technology is different from that of the second embodiment in that a plurality of polarization sections 130 is used.

[Configuration of Pixel]

Figure 15:
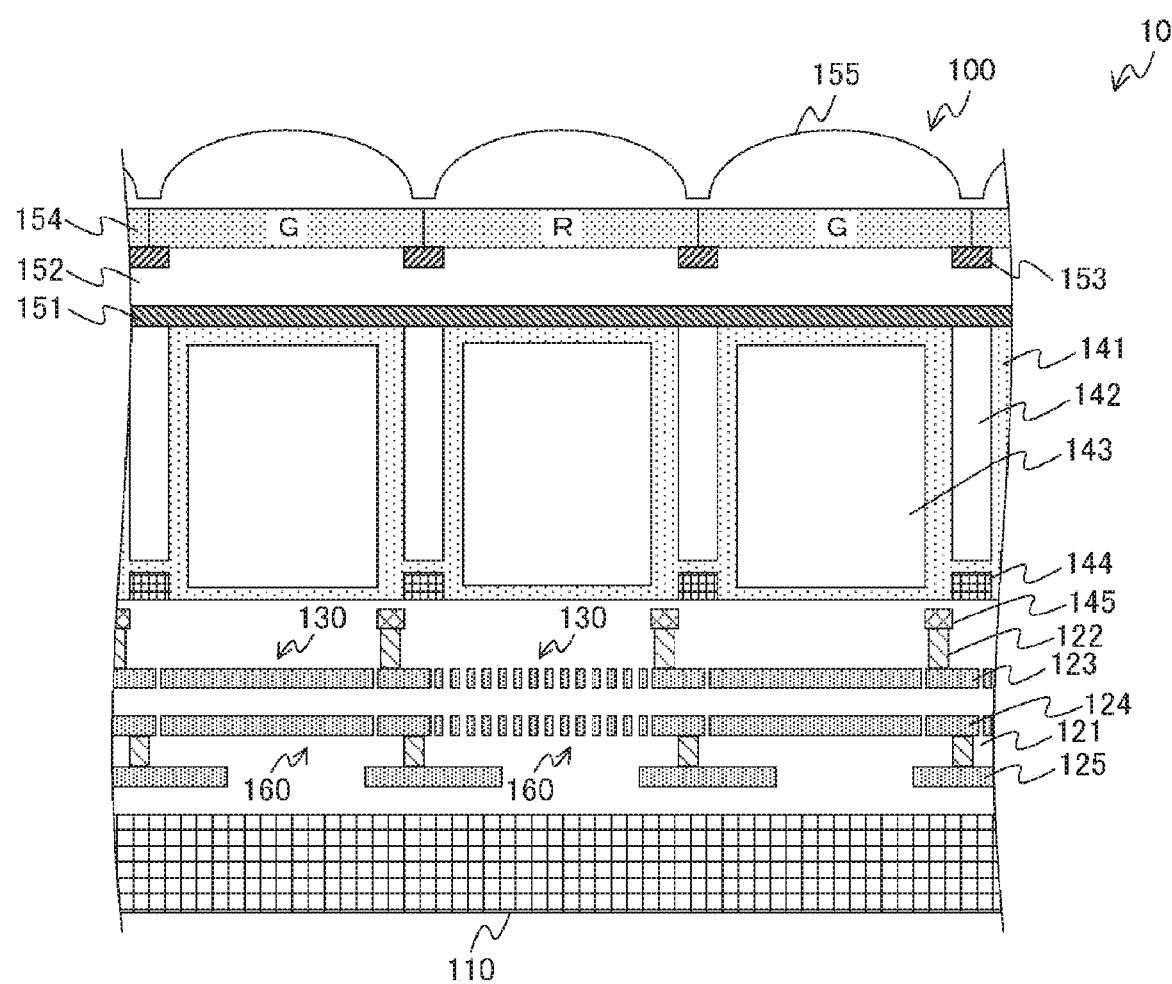
FIG. 15 is a view illustrating an example of a configuration of a pixel according to a fourth embodiment of the present technology.

FIG. 15 is a view illustrating an example of a configuration of a pixel according to the fourth embodiment of the present technology. FIG. 3 is a schematic cross-sectional view illustrating an example of a configuration of a pixel 100 arranged in the pixel array section 10. The pixel 100 in FIG. 15 is different from the pixel 100 described with reference to FIG. 8 in that the pixel 100 further includes a polarization section 160. The polarization section 160 in FIG. 15 is arranged between a wiring layer 125 and a semiconductor substrate 141, and can be formed simultaneously with a wiring layer 124. The polarization section 160 can be formed to implement the same polarization direction as that of the polarization section 130 arranged in the same pixel 100. As a result, incident light transmitted through a photoelectric conversion section 101 passes through the two polarization sections 130 and 160, and thus it is possible to improve an effect of blocking light in a polarization direction different from those of the polarization sections 130 and 160. That is, the light transmitted through the polarization sections 130 and 160 is strongly polarized by the two polarization sections 130 and 160, and is easily blocked by the polarization sections 130 and 160 of the pixel 100 when being incident on an adjacent pixel 100. Therefore, the occurrence of color mixing can be further reduced.

The polarization sections 130 and 160 can be formed simultaneously with the wiring layers 123 and 124, respectively, and production of the polarization sections 130 and 160 can be simplified.

Note that the configuration of the image capturing element 1 according to the fourth embodiment of the present technology is not limited to the above-described example.

For example, the polarization section 130 described with reference to FIG. 3 can be used instead of the polarization section 160. Furthermore, in a case where four or more wiring layers are arranged, three or more polarization sections formed simultaneously with the wiring layers may be stacked.

Other configurations of the image capturing element 1 are similar to those of the image capturing element 1 described in the second embodiment of the present technology, and thus a description thereof will be omitted.

As described above, the image capturing element 1 according to the fourth embodiment of the present technology can further reduce the occurrence of crosstalk by arranging a plurality of polarization sections in the pixel 100.

5. Fifth Embodiment

In the image capturing element 1 according to the first embodiment described above, the polarization section 130 is arranged between the first wiring layer 123 and the semiconductor substrate 141. On the other hand, an image capturing element 1 according to a fifth embodiment of the present technology is different from that of the first embodiment in that a polarization section 130 is arranged on the same level as that of a via plug 122.
[Configuration of Pixel]

Figure 16:
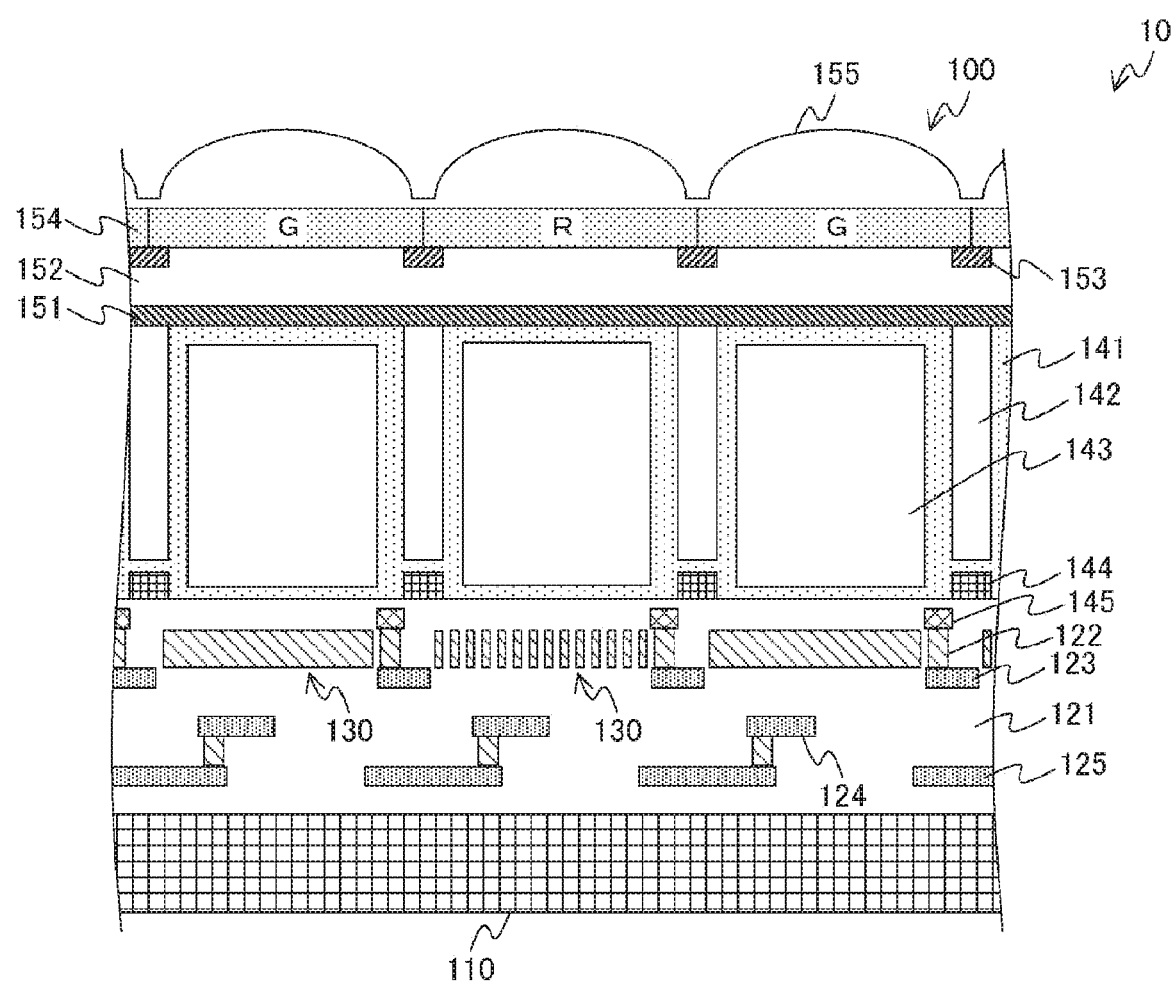
FIG. 16 is a view illustrating an example of a configuration of a pixel according to a fifth embodiment of the present technology.

FIG. 16 is a view illustrating an example of a configuration of a pixel according to the fifth embodiment of the present technology. The pixel 100 in FIG. 16 is different from the pixel 100 described with reference to FIG. 3 in that the polarization section 130 is arranged on the same level as that of the via plug 122. The polarization section 130 in FIG. 16 can be formed simultaneously with the via plug 122.
[Method of Producing Polarization Section]

Figure 17A:
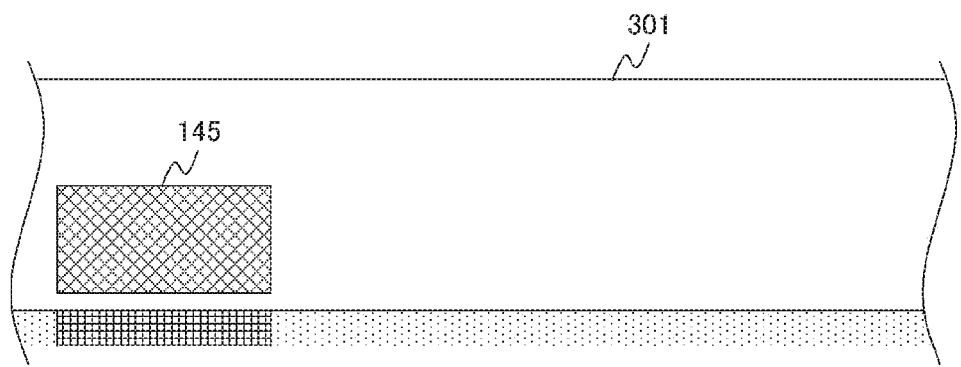
Figure 17B:
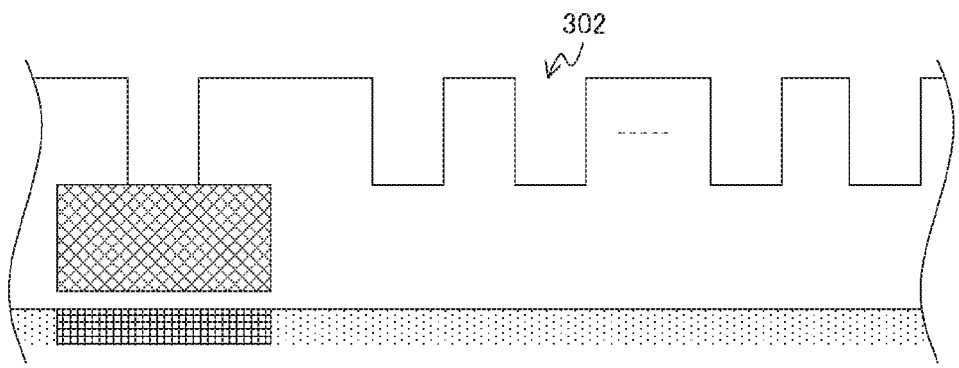
Figure 17C:
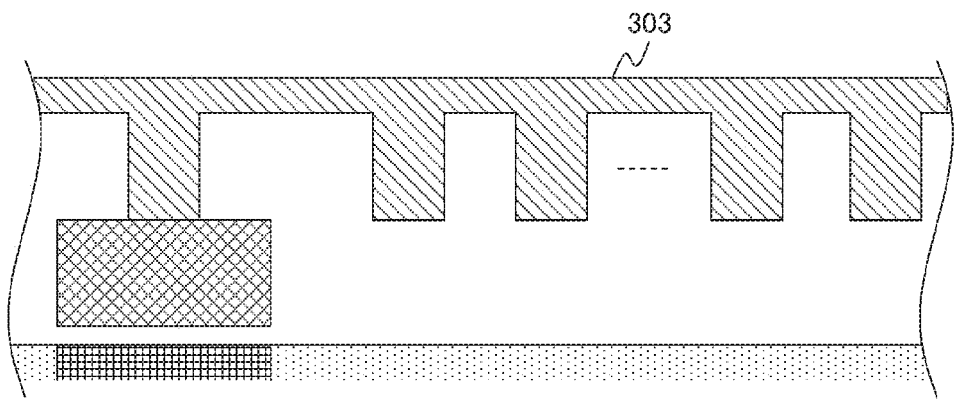
Figure 17D:
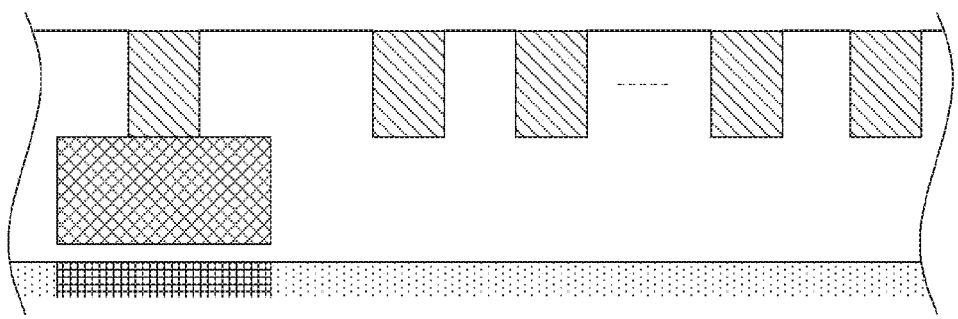

FIGS. 17A, 17B, 7C, and 7D are views illustrating an example of a method of producing the polarization section according to the fifth embodiment of the present technology. FIGS. 12A, 12B, 12C, 13A, 13B, and 13C each are views illustrating a process of producing the polarization section 130. First, a gate 145 and the like are formed after forming an oxidation film by thermally oxidizing a front surface of a semiconductor substrate 141. Next, an oxide film 301 is formed (FIG. 17A). Next, an opening portion 302 is formed by etching the oxide film 301 in a region where the via plug 122 and a light-shielding line 139 are to be formed (FIG. 17B). Next, a metal layer 303 is formed. This can be performed by, for example, CVD (FIG. 17C). Next, the surface is ground by CMP to remove the metal layer 303 that is arranged in a region other than the opening portion 302 and perform planarization (FIG. 17D). By doing so, the polarization section 130 can be formed.

Other configurations of the image capturing element 1 are similar to those of the image capturing element 1 described in the second embodiment of the present technology, and thus a description thereof will be omitted.

As described above, in the image capturing element 1 according to the fifth embodiment of the present technology, a process of producing the image capturing element 1 can be simplified by forming the polarization section 130 and the via plug 122 at the same time.

6. Sixth Embodiment

In the image capturing element 1 according to the first embodiment described above, the polarization section 130 is arranged between the first wiring layer 123 and the semiconductor substrate 141. On the other hand, an image capturing element 1 according to a sixth embodiment of the present technology is different from that of the first embodiment in that a polarization section is further arranged between a semiconductor substrate 141 and a subject.
[Configuration of Pixel]

Figure 18:
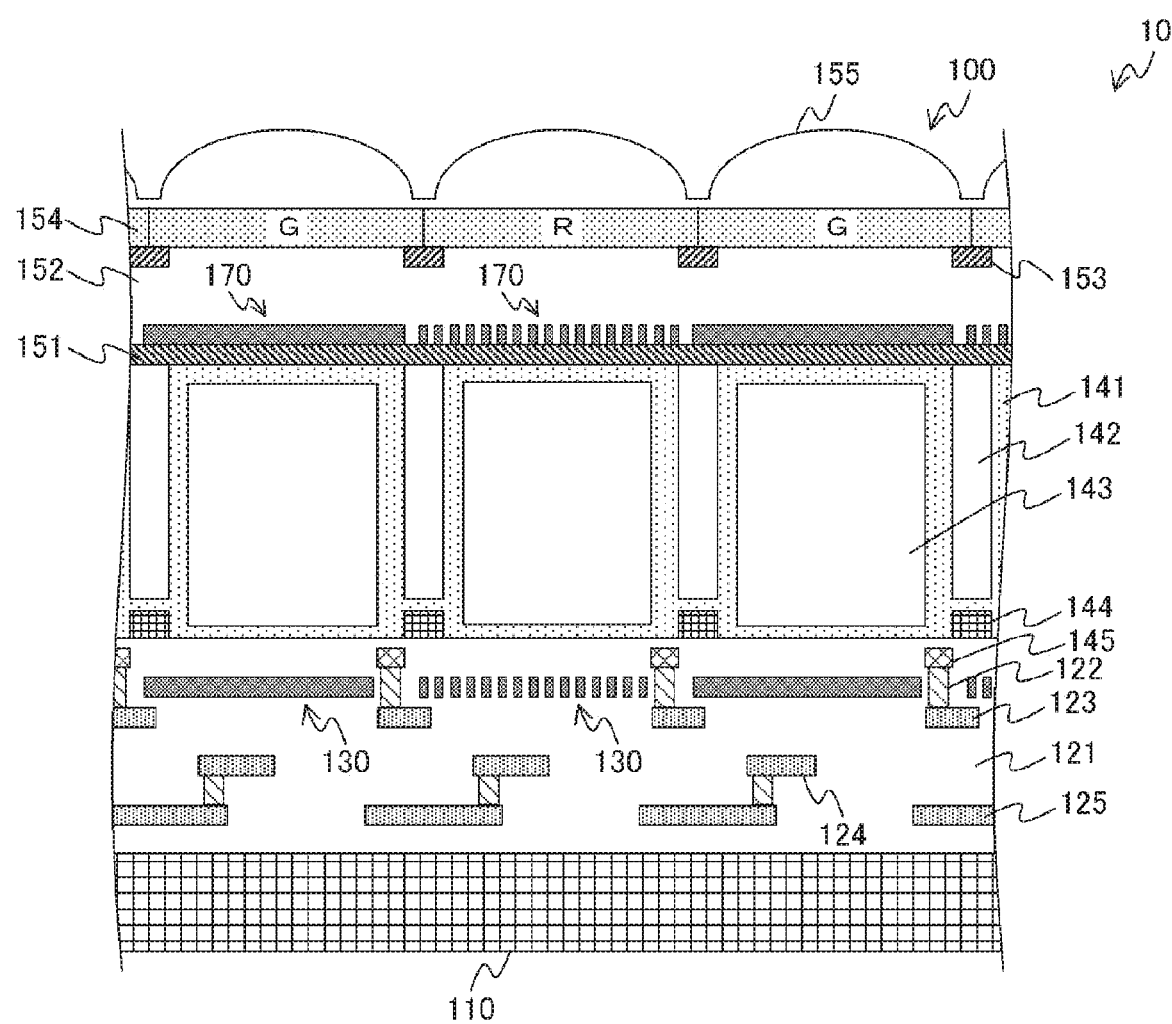
FIG. 18 is a view illustrating an example of a configuration of a pixel according to a sixth embodiment of the present technology.

FIG. 18 is a view illustrating an example of a configuration of a pixel according to the sixth embodiment of the present technology. The pixel 100 in FIG. 18 is different from the pixel 100 described with reference to FIG. 3 in that the pixel 100 further includes a polarization section 170. The polarization section 170 is arranged between an insulating film 151 and a planarizing film 152. The polarization section 170 allow transmission of light in a specific polarization direction among incident light on the pixel 100. Furthermore, the polarization section 170 is configured such that a polarizing direction is different from that of an adjacent pixel 100 by 45°. As the polarization section 170 is arranged between the subject and the photoelectric conversion section 101, light corresponding to the polarization direction of the polarization section 170 among light from the subject can be incident on the pixel 100. It is possible to acquire polarization information of the incident light by generating an image signal based on the incident light.

A three-dimensional shape of the subject can be easily grasped by acquiring the polarization information. This is because light reflected from an object is polarized in a different direction for each surface of the object, and thus a shape of the surface of the object can be easily grasped by selecting the polarization direction and performing image capturing. Furthermore, in an image capturing element used for a monitoring device or the like, polarization information can be used to remove an image reflected on a windshield of a car. This is because the image reflected on the windshield of the car is strongly polarized in a specific direction and can be easily removed by acquiring the polarization information.

The three-dimensional shape of the subject can be acquired as follows. First, four image signals are generated by each pixel 100 in which four polarization sections 170 of which polarization directions are different from one another by 45° are arranged. Next, changes in luminance of the four image signals in a target region of the subject are detected, and a normal direction of a tangent plane of the target region is calculated. The three-dimensional shape of the subject can be acquired by identifying a surface to which the target region belongs on the basis of the calculated normal direction.

It is possible to acquire accurate polarization information and improve accuracy in detection of the normal direction by increasing an extinction ratio, which is a ratio in which light in a direction different from the polarization direction of the polarization section 170 is removed. However, in such an image capturing element 1, when crosstalk occurs, the extinction ratio is decreased. By arranging the polarization section 130, it is possible to reduce the occurrence of crosstalk, prevent a decrease in the extinction ratio, and improve the accuracy in detection of the normal direction. As a result, a precise three-dimensional shape of the subject can be acquired.
[Arrangement of Polarization Section]

Figure 19A:
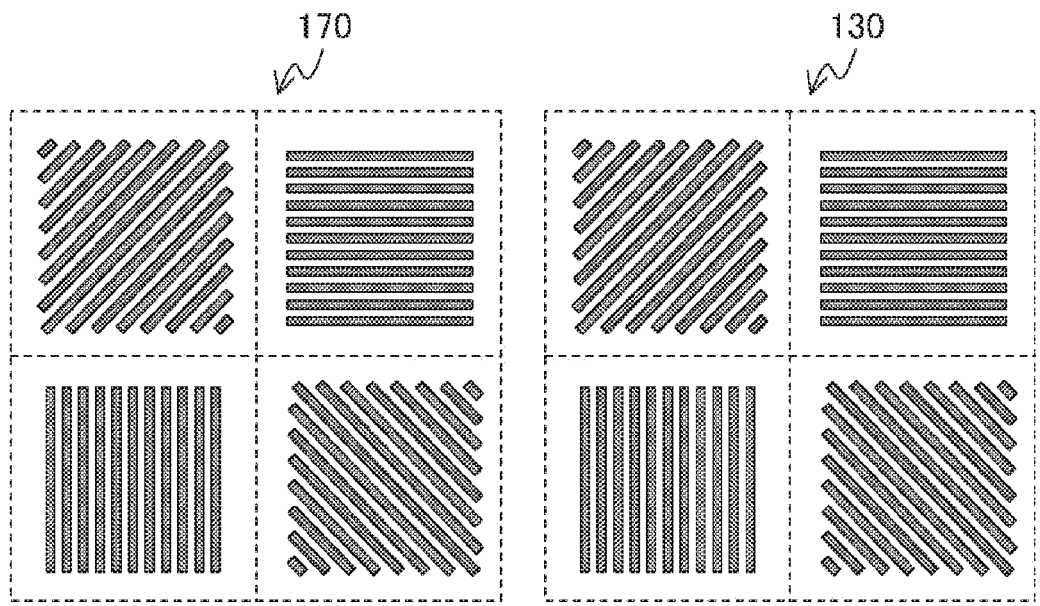
FIGS. 19A and 19B are views illustrating an example of arrangement of the polarization sections according to the sixth embodiment of the present technology.
Figure 19B:
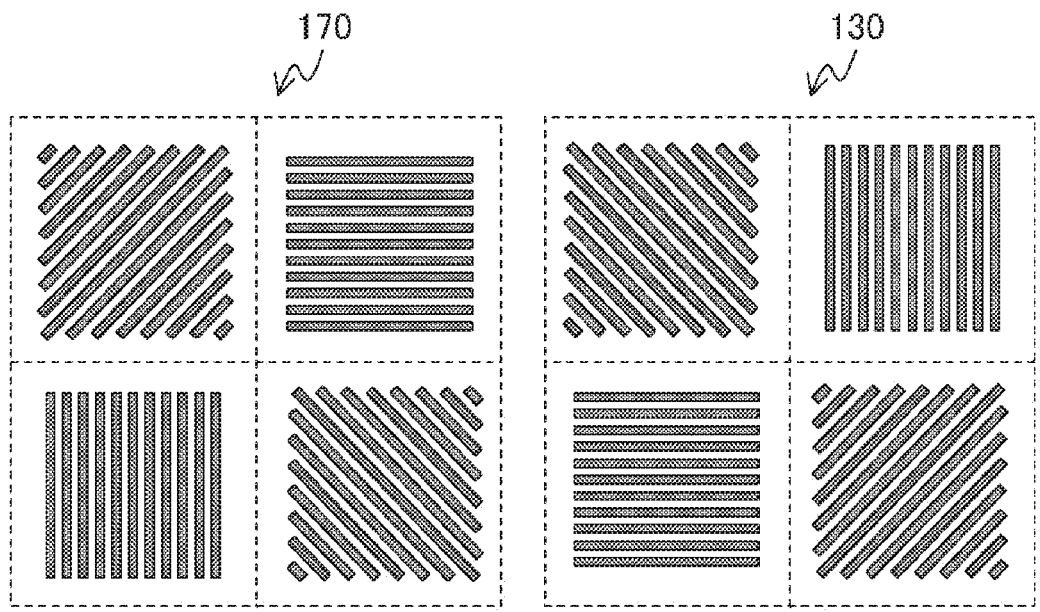

FIGS. 19A and 19B are views illustrating an example of arrangement of the polarization sections according to the sixth embodiment of the present technology. FIGS. 19A and 19B are views illustrating the polarization directions of the polarization sections 170 and 130 in the pixel 100. In FIGS. 19A and 19B, FIG. 19A illustrates an example in which the polarization directions of the polarization sections 170 and 130 arranged in the pixel 100 are the same. In this case, similarly to the image capturing element 1 described with reference to FIG. 15, it is possible to improve the effect of blocking light in a polarization direction different from the polarization directions of the polarization sections 170 and 130. On the other hand, in FIGS. 19A and 19B, FIG. 19B illustrates an example in which the polarization sections 170 and 130 of which polarization directions are different from each other are arranged in the pixel 100. In this case, light transmitted through the polarization section 130 can be reduced by the polarization sections 170 and 130 of which polarization directions are different from each other. Therefore, light incident on an adjacent pixels 100 can be reduced. As described above, the occurrence of crosstalk can be reduced in both of the image capturing elements 1 in FIGS. 19A and 19B, and the decrease in the extinction ratio can be reduced.

Other configurations of the image capturing element 1 are similar to those of the image capturing element 1 described in the first embodiment of the present technology, and thus a description thereof will be omitted.

As described above, in the image capturing element 1 according to the sixth embodiment of the present technology, it is possible to reduce the occurrence of crosstalk in the image capturing element 1 that acquires polarization information of light from the subject, and reduce the decrease in the extinction ratio. As a result, it is possible to improve the accuracy in calculation of the normal direction when acquiring the three-dimensional shape of the subject.

7. Example of Application to Camera

The present technology can be applied to various products. For example, the present technology may be realized as an image capturing element mounted on an image capturing device such as a camera or the like.

Figure 20:
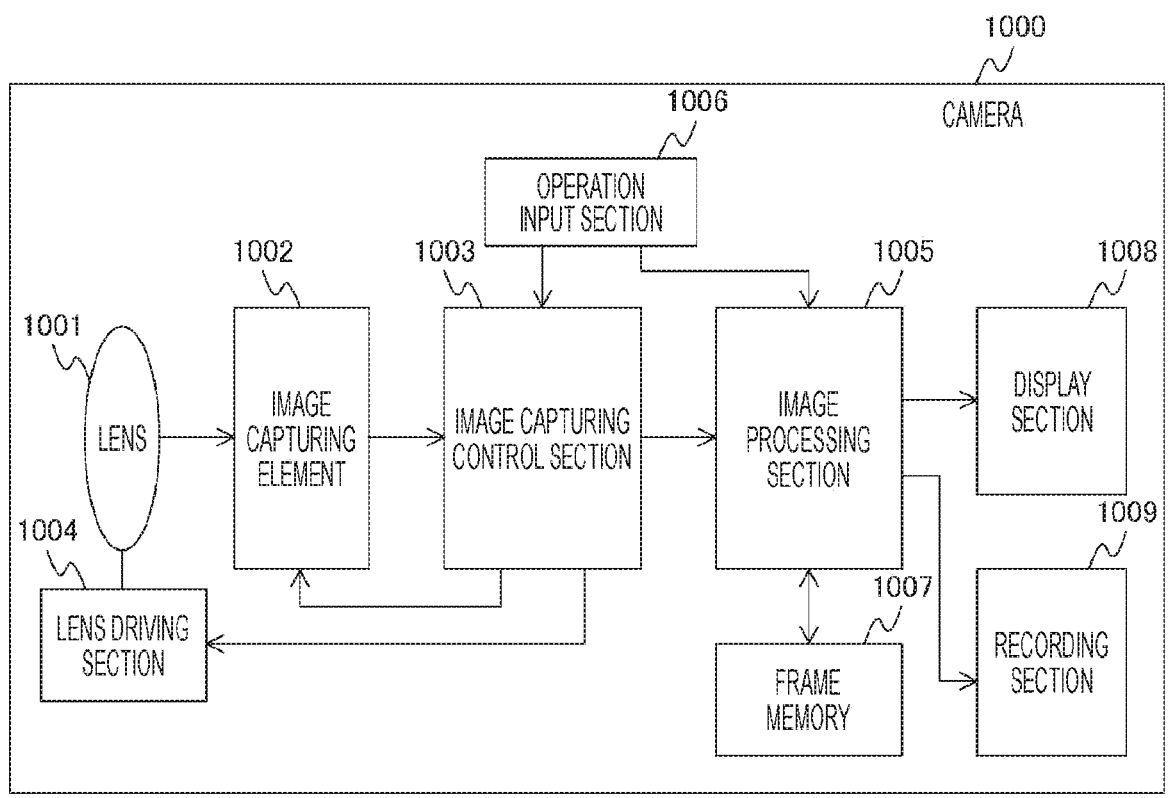
FIG. 20 is a block diagram illustrating an example of a schematic configuration of a camera that is an example of an image capturing device to which the present technology can be applied.

FIG. 20 is a block diagram illustrating an example of a schematic configuration of a camera that is an example of the image capturing device to which the present technology can be applied. A camera 1000 in FIG. 20 includes a lens 1001, an image capturing element 1002, an image capturing control section 1003, a lens driving section 1004, an image processing section 1005, an operation input section 1006, a frame memory 1007, a display section 1008, and a recording section 1009.

The lens 1001 is an imaging lens of the camera 1000. The lens 1001 collects light from a subject and makes the light incident on the image capturing element 1002 as described later to form an image of the subject.

The image capturing element 1002 is a semiconductor element that captures light from the subject, the light being collected by the lens 1001. The image capturing element 1002 generates an analog image signal corresponding to the radiated light, converts the analog image signal into a digital image signal, and outputs the digital image signal.

The image capturing control section 1003 controls image capturing performed by the image capturing element 1002. The image capturing control section 1003 controls the image capturing element 1002 by generating a control signal and outputting the control signal to the image capturing element 1002. Furthermore, the image capturing control section 1003 can perform autofocus in the camera 1000 on the basis of the image signal output from the image capturing element 1002. Here, the autofocus is a system that detects a focal position of the lens 1001 and automatically adjusts the focal position. As the autofocus, a method (image plane phase difference autofocus) in which a focal position is detected by detecting an image plane phase difference by a phase difference pixel arranged in the image capturing element 1002 can be used. Alternatively, a method (contrast autofocus) in which a position where the contrast of the image becomes the highest is detected as the focal position can be applied. The image capturing control section 1003 adjusts a position of the lens 1001 through the lens driving section 1004 on the basis of the detected focal position, and performs the autofocus. Note that the image capturing control section 1003 can be implemented by, for example, a digital signal processor (DSP) equipped with firmware.

The lens driving section 1004 drives the lens 1001 on the basis of the control of the image capturing control section 1003. The lens driving section 1004 can drive the lens 1001 by changing the position of the lens 1001 by using a built-in motor.

The image processing section 1005 processes the image signal generated by the image capturing element 1002. Examples of the processing include demosaicing for generating an image signal corresponding to a missing color among image signals corresponding to red, green, and blue for each pixel, noise reduction for eliminating noise of the image signal, encoding of the image signal, and the like. The image processing section 1005 can be implemented by, for example, a microcomputer equipped with firmware.

The operation input section 1006 receives an operation input from a user of the camera 1000. As the operation input section 1006, for example, a push button or a touch panel can be used. The operation input received by the operation input section 1006 is transmitted to the image capturing control section 1003 or the image processing section 1005. Thereafter, processing corresponding to the operation input, for example, processing such as capturing of an image of a subject, or the like is started.

The frame memory 1007 is a memory that stores a frame that is an image signal for one screen. The frame memory 1007 is controlled by the image processing section 1005, and holds frames in a course of image processing.

The display section 1008 displays an image processed by the image processing section 1005. As the display section 1008, for example, a liquid crystal panel can be used.

The recording section 1009 records an image processed by the image processing section 1005. As the recording section 1009, for example, a memory card or a hard disk can be used.

Hereinabove, the camera to which the present invention can be applied has been described. The present technology can be applied to the image capturing element 1002 in the configuration described above. Specifically, the image capturing element 1 described in FIG. 1 can be applied as the image capturing element 1002. As the image capturing element 1 is applied as the image capturing element 1002, the occurrence of color mixing can be reduced, and the image quality of the image generated by the camera 1000 can be prevented from deteriorating. Note that the image processing section 1005 is an example of a processing circuit described in the claims. The camera 1000 is an example of the image capturing device described in the claims.

Note that although the camera has been described as an example here, the technology according to the present invention may also be applied to, for example, a monitoring device or the like.

8. Example of Application to Endoscopic Operation System

The technology (present technology) according to the present disclosure can be applied to various products. For example, the technology according to the present disclosure may be applied to an endoscopic operation system.

Figure 21:
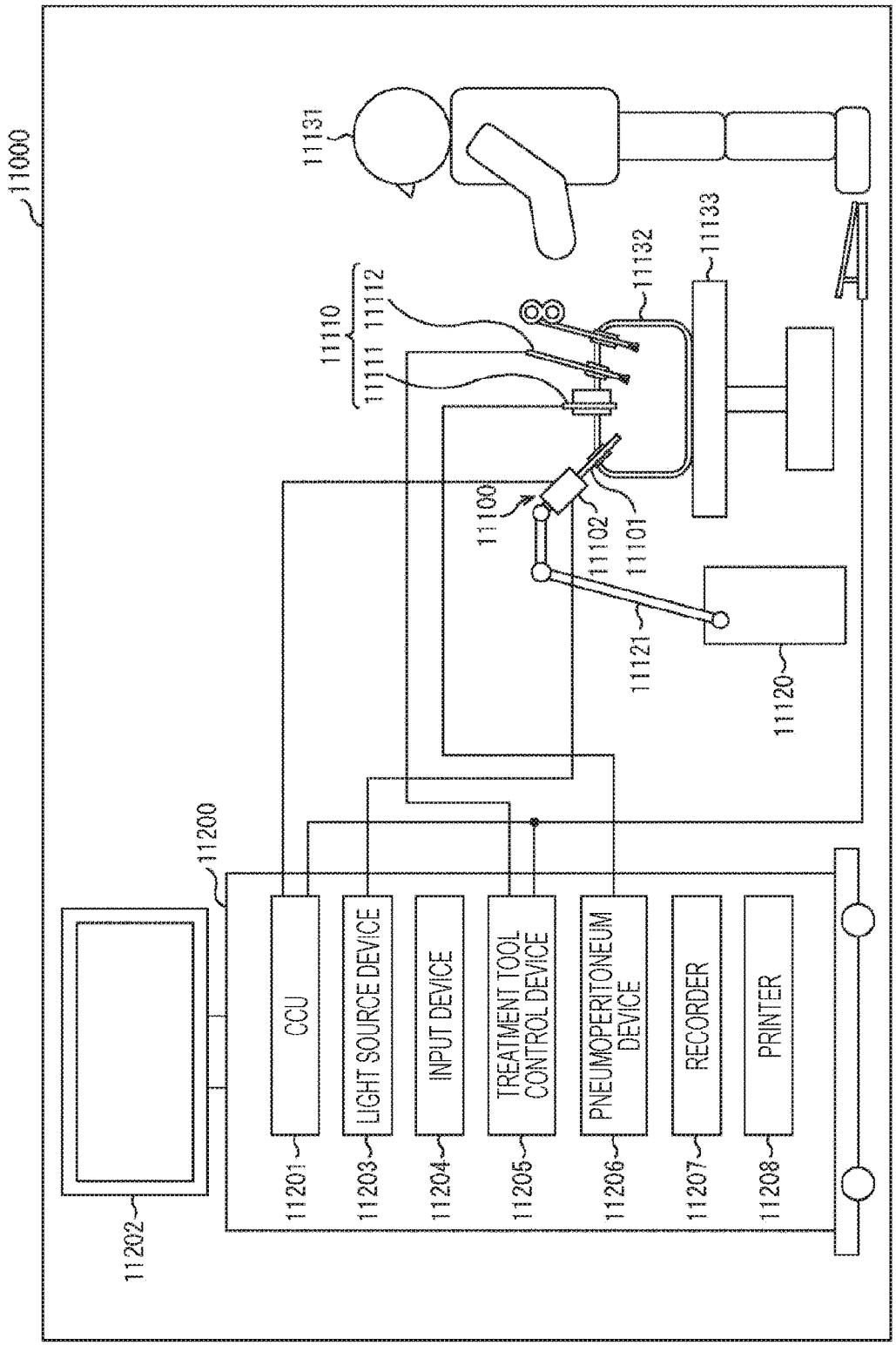
FIG. 21 is a diagram illustrating an example of a schematic configuration of an endoscopic operation system.

FIG. 21 is a diagram illustrating an example of a schematic configuration of an endoscopic operation system to which the technology (the present technology) according to the present disclosure can be applied.

FIG. 21 illustrates a situation in which an operator (surgeon) 11131 performs an operation on a patient 11132 on a patient bed 11133 by using an endoscopic operation system 11000. As illustrated in FIG. 21, the endoscopic operation system 11000 includes an endoscope 11100, other operation tools 11110 such as a pneumoperitoneum tube 11111, an energy treatment tool 11112, or the like, a support arm device 11120 supporting the endoscope 11100, and a cart 11200 in which various devices for an endoscopic operation are loaded.

The endoscope 11100 includes a lens barrel 11101 of which a region having a predetermined length from a tip end is inserted into the body cavity of the patient 11132, and a camera head 11102 connected to a base end of the lens barrel 11101. In the example illustrated in FIG. 21, the endoscope 11100 implemented as a so-called hard mirror including the hard lens barrel 11101 is illustrated, but the endoscope 11100 may also be implemented as a so-called flexible mirror including a flexible lens barrel.

An opening portion in which an object lens is fitted is provided in the tip end of the lens barrel 11101. A light source device 11203 is connected to the endoscope 11100, and light generated by the light source device 11203 is guided to the tip end of the lens barrel by a light guide extending in the inside of the lens barrel 11101, and radiated to an observation target in the body cavity of the patient 11132 through the object lens. Note that the endoscope 11100 may be a forward-viewing endoscope, an oblique-viewing endoscope, or a side-viewing endoscope.

An optical system and an image capturing element are provided in the camera head 11102, and reflected light (observation light) from the observation target is collected to the image capturing element by the optical system. The observation light is subjected to photoelectrical conversion by the image capturing element, and an electric signal corresponding to the observation light, that is, an image signal corresponding to an observation image is generated. The image signal is sent as RAW data to a camera control unit (CCU) 11201.

The CCU 11201 includes a central processing unit (CPU), a graphics processing unit (GPU), and the like, and generally controls operations of the endoscope 11100 and a display device 11202. Moreover, the CCU 11201 receives an image signal from the camera head 11102 and performs, on the image signal, various types of image processing for displaying an image based on the image signal, such as, for example, development processing (demosaic processing) or the like.

The display device 11202 displays an image based on the image signal subjected to the image processing by the CCU 11201 according to the control of the CCU 11201.

The light source device 11203 includes a light source such as a light emitting diode (LED) or the like, and supplies, to the endoscope 11100, irradiation light at the time of capturing an image of an operational site or the like.

The input device 11204 is an input interface for the endoscopic operation system 11000. A user can input various information or instruction to the endoscopic operation system 11000 through the input device 11204. For example, the user inputs an instruction to change an image capturing condition (a type of irradiation light, magnification, a focal length, and the like) of the endoscope 11100, or the like.

A treatment tool control device 11205 controls driving of the energy treatment tool 11112 for cauterizing tissues, making an incision, sealing a blood vessel, or the like. In order to inflate the body cavity of the patient 11132 for the purpose of securing a field of view of the endoscope 11100 and a working space of the operator, the pneumoperitoneum device 11206 feeds gas into the body cavity through the pneumoperitoneum tube 11111. A recorder 11207 is a device which is capable of recording various information associated with the operation. A printer 11208 is a device which is capable of printing various information associated with the operation in various forms such as a text, an image, a graph, and the like.

Note that the light source device 11203 supplying the irradiation light at the time of capturing an image of the operational site by the endoscope 11100 can include a white light source implemented by, for example, an LED, a laser light source, or a combination thereof. In a case where the white light source is implemented by a combination of red, green, and blue (RGB) laser light sources, since an output intensity and an output timing of each color (each wavelength) can be controlled with high precision, it is possible to adjust white balance of a captured image in the light source device 11203. Furthermore, in this case, laser light from each of the RGB laser light sources is radiated to the observation target in a time-division manner, and driving of the image capturing element of the camera head 11102 is controlled in synchronization with the irradiation timing, such that it is possible to capture an image corresponding to each of RGB in a time-division manner. According to the above-described method, it is possible to obtain a color image without providing a color filter in the image capturing element.

Furthermore, driving of the light source device 11203 may be controlled so that an intensity of output light is changed at each predetermined time. Driving of the image capturing element of the camera head 11102 is controlled in synchronization with a timing of a change of the light intensity to acquire an image in a time-division manner, and the image is synthesized, such that it is possible to generate an image with a high dynamic range and without so-called blown-out highlights and blocked-up shadows.

Furthermore, the light source device 11203 may be configured such that the light source device 11203 is able to supply light in a predetermined wavelength band corresponding to special light observation. In the special light observation, for example, light in a narrower band in comparison to that of irradiation light (in other words, white light) at the time of general observation is radiated by using a dependence of light absorption of a body tissue on a wavelength, such that so-called narrow band imaging, in which an image of a predetermined tissue such as a blood vessel of a mucous membrane surface layer or the like is captured with high contrast, is performed. Alternatively, in the special light observation, fluorescence observation in which an image is obtained by fluorescence generated by radiation of excited light may be performed. In the fluorescence observation, it is possible to observe fluorescence from a body tissue by radiating excited light to the body tissue (self-fluorescence observation), to obtain a fluorescence image by locally injecting a reagent such as indocyanine green (ICG) or the like into a body tissue and radiating excited light corresponding to a fluorescence wavelength of the reagent to the body tissue, or the like. The light source device 11203 can be configured such that the light source device 11203 is able to supply light in a narrow band and/or excited light corresponding to such a special light observation.

Figure 22:
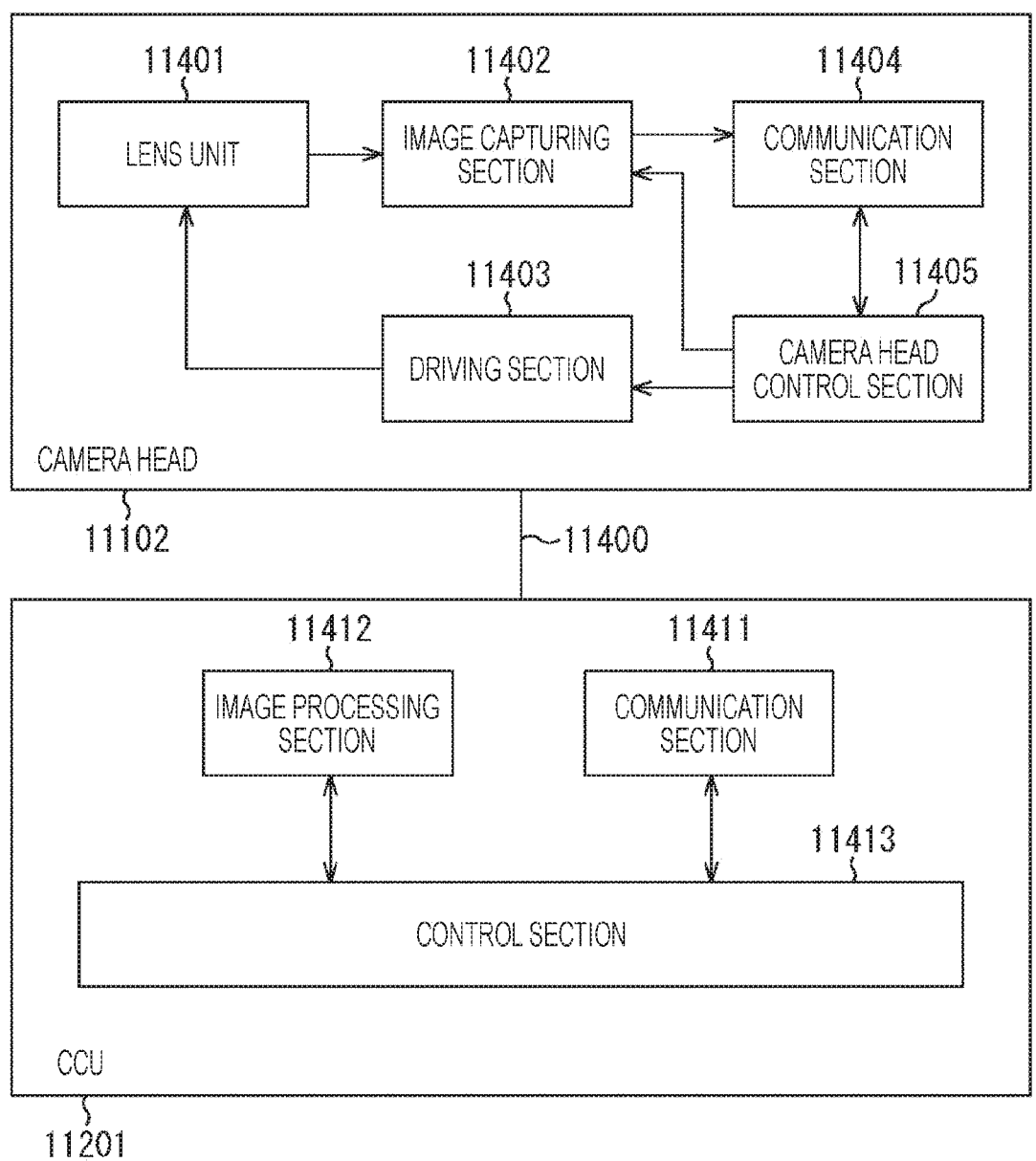
FIG. 22 is a block diagram illustrating an example of functional configurations of a camera head and a camera control unit (CCU).

FIG. 22 is a block diagram illustrating an example of functional configurations of the camera head 11102 and the CCU 11201 illustrated in FIG. 21.

The camera head 11102 includes a lens unit 11401, an image capturing section 11402, a driving section 11403, a communication section 11404, and a camera head control section 11405. The CCU 11201 includes a communication section 11411, an image processing section 11412, and a control section 11413. The camera head 11102 and the CCU 11201 are mutually communicably connected to each other by a transmission cable 11400.

The lens unit 11401 is an optical system provided in a portion of the camera head 11102 connected to the lens barrel 11101. Observation light introduced from the tip end of the lens barrel 11101 is guided to the camera head 11102 and is incident on the lens unit 11401. The lens unit 11401 includes an assembly of a plurality of lenses including a zoom lens and a focus lens.

The image capturing section 11402 includes an image capturing element. The number of image capturing elements constituting the image capturing section 11402 may be one (so-called single-plate type) or plural (so-called multi-plate type). In a case where the image capturing section 11402 is configured as the multi-plate type, for example, a color image may be obtained by generating image signals corresponding to RGB, respectively, by each image capturing element, and synthesizing the image signals. Alternatively, the image capturing section 11402 may also include a pair of image capturing elements for acquiring each of an image signal for the right eye and an image signal for the left eye that are used for three-dimensional (3D) display. As the 3D display is performed, the operator 11131 can more accurately grasp a depth of a biological tissue in an operational site. Note that in a case where the image capturing section 11402 is configured as the multi-plate type, a plurality of lens units 11401 can be provided for the respective image capturing elements.

Furthermore, the image capturing section 11402 is not required to be necessarily provided in the camera head 11102. For example, the image capturing section 11402 may also be provided inside the lens barrel 11101 right behind the object lens.

The driving section 11403 is implemented by an actuator and moves only a predetermined distance along an optical axis of the zoom lens and the focus lens of the lens unit 11401 according to a control of the camera head control section 11405. With this arrangement, it is possible to appropriately adjust magnification and focus of an image captured by the image capturing section 11402.

The communication section 11404 is implemented by a communication device for transmitting and receiving various information to and from the CCU 11201. The communication section 11404 sends an image signal obtained from the image capturing section 11402 as RAW data to the CCU 11201 through the transmission cable 11400.

Furthermore, the communication section 11404 receives a control signal for controlling the driving of the camera head 11102 from the CCU 11201, and supplies the received control signal to the camera head control section 11405. The control signal includes information regarding image capturing conditions, such as information for specifying a frame rate of a captured image, information for specifying an exposure value at the time of image capturing, and/or information for specifying magnification and focus of a captured image.

Note that the image capturing conditions such as the frame rate, the exposure value, the magnification, the focus, and the like may be appropriately specified by a user, or may be automatically set by the control section 11413 of the CCU 11201 on the basis of the acquired image signal. In a case of the automatic setting, the endoscope 11100 has a so-called auto exposure (AE) function, an auto focus (AF) function, and an auto white balance (AWB) function.

The camera head control section 11405 controls the driving of the camera head 11102 on the basis of the control signal received from the CCU 11201 through the communication section 11404.

The communication section 11411 is implemented by a communication device for transmitting and receiving various information to and from the camera head 11102. The communication section 11411 receives an image signal sent from the camera head 11102 through the transmission cable 11400.

Furthermore, the communication section 11411 sends, to the camera head 11102, a control signal for controlling the driving of the camera head 11102. The image signal or the control signal can be sent through electric communication, optical communication, or the like.

The image processing section 11412 performs various types of image processing on an image signal which is RAW data sent from the camera head 11102.

The control section 11413 performs various types of control related to image capturing of an operational site or the like performed by the endoscope 11100, and displaying of a captured image obtained by performing the image capturing of the operational site or the like. For example, the control section 11413 generates a control signal for controlling the driving of the camera head 11102.

Furthermore, the control section 11413 controls the display device 11202 to display a captured image in which an operational site or the like is reflected on the basis of the image signal subjected to the image processing by the image processing section 11412. At this time, the control section 11413 may recognize various objects in the captured image by using various image recognition technologies. For example, the control section 11413 can recognize an operation tool such as forceps or the like, a specific part of a living body, bleeding, mist at the time of using the energy treatment tool 11112, or the like by detecting a shape of an edge, a color, or the like of an object included in the captured image. The control section 11413 may control the display device 11202 to display various operation support information so as to be superimposed on the image of the operational site by using a result of the recognition at the time of displaying the captured image on the display device 11202. As the operation support information is displayed in a superimposing manner and presented to the operator 11131, it is possible to decrease a load on the operator 11131 and the operator 11131 can surely proceed with the operation.

The transmission cable 11400 connecting the camera head 11102 and the CCU 11201 is an electric signal cable corresponding to electric signal communication, an optical fiber corresponding to optical communication, or a composite cable thereof.

Here, although wired communication using the transmission cable 11400 is performed in the example illustrated in the drawing, the communication between the camera head 11102 and the CCU 11201 may also be wireless communication.

Hereinabove, an example of the endoscopic operation system to which the technology according to the present disclosure can be applied has been described. The technology according to the present disclosure can be applied to the endoscope 11100 or the image capturing section 11402 of the camera head 11102 in the configuration described above. Specifically, the image capturing element 1 in FIG. 1 can be applied as the endoscope 11100 or the image capturing section 10402 of the camera head 11102. The occurrence of crosstalk can be reduced by applying the technology according to the present disclosure to the image capturing section 10402 and thus a clearer image of the operational site can be obtained, such that the operator can clearly see the operational site.

Note that although the endoscopic operation system has been described as an example here, the technology according to the present disclosure may also be applied to, for example, a microscopic operation system or the like.

9. Example of Application to Moving Body

The technology (present technology) according to the present disclosure can be applied to various products. For example, the technology according to the present disclosure may be implemented as a device mounted in any one of moving bodies such as a vehicle, an electric vehicle, a hybrid electric vehicle, a motorcycle, a bicycle, a personal mobility device, a plane, a drone, a ship, a robot, and the like.

Figure 23:
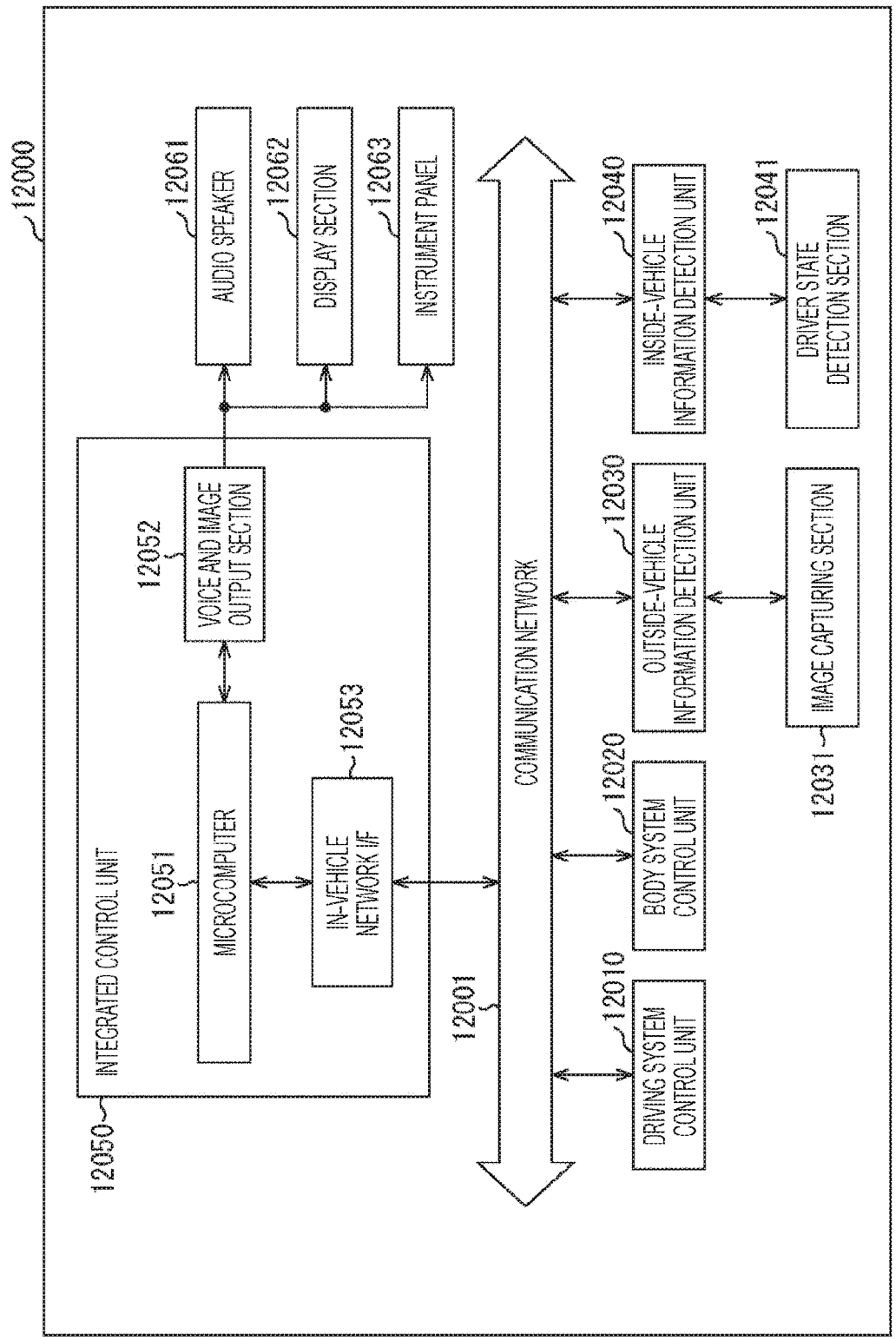
FIG. 23 is a block diagram illustrating an example of a schematic configuration of a vehicle control system.

FIG. 23 is a block diagram illustrating an example of a schematic configuration of a vehicle control system which is an example of a moving body control system to which the technology according to the present disclosure can be applied.

A vehicle control system 12000 includes a plurality of electronic control units connected through a communication network 12001. In the example illustrated in FIG. 23, the vehicle control system 12000 includes a driving system control unit 12010, a body system control unit 12020, an outside-vehicle information detection unit 12030, an inside-vehicle information detection unit 12040, and an integrated control unit 12050. Furthermore, as a functional configuration of the integrated control unit 12050, a microcomputer 12051, a voice and image output section 12052, and an in-vehicle network interface (I/F) 12053 are illustrated.

The driving system control unit 12010 controls an operation of a device related to a driving system of a vehicle according to various programs. For example, the driving system control unit 12010 functions as a control device such as a driving force generation device for generating a driving force of a vehicle such as an internal combustion engine, a driving motor, or the like, a driving force transmission mechanism for transmitting a driving force to vehicle wheels, a steering mechanism for adjusting a steering angle of the vehicle, a brake device for generating a braking force of the vehicle, or the like.

The body system control unit 12020 controls an operation of various devices mounted in a vehicle body according to various programs. For example, the body system control unit 12020 functions as a keyless entry system, a smart key system, a power window device, or a control device for various lamps such as a head lamp, a back lamp, a brake lamp, a blinker, a fog lamp, and the like. In this case, electric waves sent from a portable machine substituting for a key and a signal of various switches can be input to the body system control unit 12020. The body system control unit 12020 receives the electric waves or the signal to control a door-lock device of a vehicle, a power window device, a lamp, or the like.

The outside-vehicle information detection unit 12030 detects information regarding an outside area of a vehicle in which the vehicle control system 12000 is mounted. For example, an image capturing section 12031 is connected to the outside-vehicle information detection unit 12030. The outside-vehicle information detection unit 12030 causes the image capturing section 12031 to capture an image of an area outside the vehicle, and receives the captured image. The outside-vehicle information detection unit 12030 may perform processing of detecting an object such as a person, a car, an obstacle, a sign, a letter on a road surface, or the like, or perform distance detection processing on the basis of the received image.

The image capturing section 12031 is an optical sensor that receives light and outputs an electric signal corresponding to the amount of received light. The image capturing section 12031 can output the electric signal as an image, or can output the electric signal as distance measurement information. Furthermore, the light received by the image capturing section 12031 may be visible light or invisible light such as infrared rays or the like.

The inside-vehicle information detection unit 12040 detects information regarding an inside area of the vehicle. For example, a driver state detection section 12041 detecting a state of a driver is connected to the inside-vehicle information detection unit 12040. The driver state detection section 12041 includes, for example, a camera capturing an image of the driver, and the inside-vehicle information detection unit 12040 may calculate a degree of fatigue or a degree of concentration of the driver, or discriminate whether or not the driver dozes off on the basis of detection information input from the driver state detection section 12041.

The microcomputer 12051 can calculate a target control value of a driving force generation device, a steering mechanism, or a brake device on the basis of information regarding the inside area and the outside area of the vehicle, the information being acquired by the outside-vehicle information detection unit 12030 or the inside-vehicle information detection unit 12040, and output a control instruction to the driving system control unit 12010. For example, the microcomputer 12051 can perform a cooperative control for the purpose of implementing functions of an advanced driver assistance system (ADAS) including vehicle collision avoidance, impact alleviation, following traveling based on an inter-vehicle distance, traveling while maintaining a vehicle speed, a vehicle collision warning, a vehicle lane departure warning, or the like.

Furthermore, the microcomputer 12051 can perform a cooperative control for the purpose of an automatic driving in which a vehicle autonomously travels without an operation by a driver by controlling a driving force generation device, a steering mechanism, a brake device, or the like on the basis of information regarding a surrounding area of the vehicle acquired by the outside-vehicle information detection unit 12030 or the inside-vehicle information detection unit 12040, or the like.

Furthermore, the microcomputer 12051 can output a control instruction to the body system control unit 12020 on the basis of outside-vehicle information acquired by the outside-vehicle information detection unit 12030. For example, the microcomputer 12051 can perform a cooperative control for the purpose of preventing glare by controlling a headlamp according to a position of a preceding vehicle or an oncoming vehicle detected by the outside-vehicle information detection unit 12030 to switch a high beam to a low beam, or the like.

The voice and image output section 12052 sends an output signal of at least one of voice or an image to an output device which is capable of visually or acoustically notifying a passenger of a vehicle or an outside area of the vehicle of information. In the example in FIG. 23, an audio speaker 12061, a display section 12062, and an instrument panel 12063 are illustrated as the output devices. The display section 12062 may include at least one of, for example, an on-board display or a head-up display.

Figure 24:
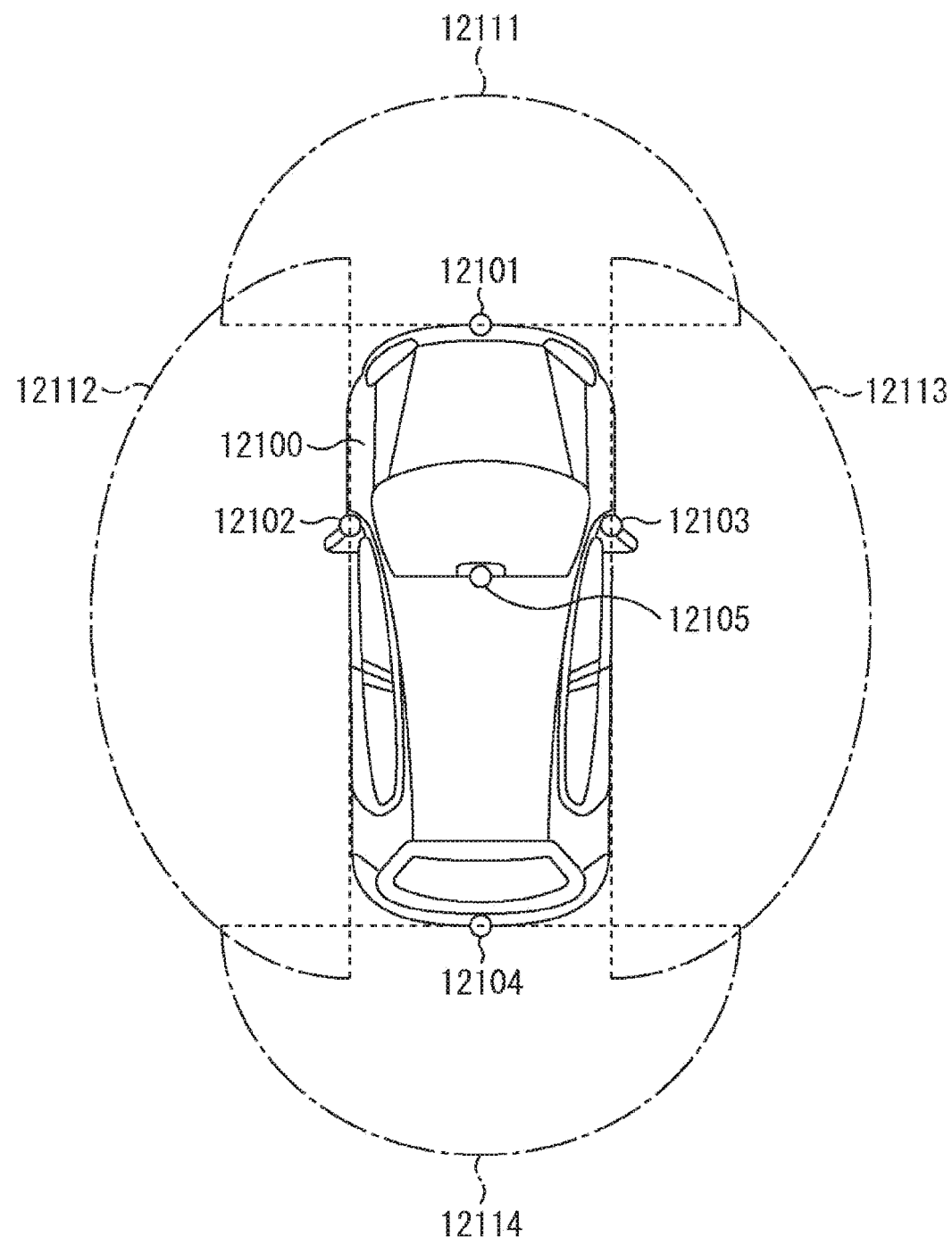
FIG. 24 is an explanatory diagram illustrating an example of installation positions of outside-vehicle information detection sections and image capturing sections.

FIG. 24 is a diagram illustrating an example of an installation position of the image capturing section 12031.

In FIG. 24, a vehicle 12100 includes image capturing sections 12101, 12102, 12103, 12104, and 12105 as the image capturing section 12031.

The image capturing sections 12101, 12102, 12103, 12104, and 12105 are provided at, for example, a front nose, side mirrors, a rear bumper, a back door, an upper portion of a windshield in a compartment, and the like of the vehicle

12100. The image capturing section 12101 provided at the front nose and the image capturing section 12105 provided at the upper portion of the windshield in the compartment mainly acquire an image of an area in front of the vehicle 12100. The image capturing sections 12102 and 12103 provided at side mirrors mainly acquire images of areas on sides of the vehicle 12100. The image capturing section 12104 provided at the rear bumper or the back door mainly acquires an image of an area behind the vehicle 12100. The image of the area in front of the vehicle 12100 acquired by the image capturing sections 12101 and 12105 is mainly used to detect a preceding vehicle, a pedestrian, an obstacle, a traffic light, a traffic sign, a lane, or the like.

Note that FIG. 24 illustrates an example of imaging ranges of the image capturing sections 12101 to 12104. An image capturing range 12111 indicates an image capturing range of the image capturing section 12101 provided at the front nose, image capturing ranges 12112 and 12113 indicate image capturing ranges of the image capturing sections 12102 and 12103 provided at the side mirrors, respectively, and an image capturing range 12114 indicates an image capturing range of the image capturing section 12104 provided at the rear bumper or the back door. For example, image data captured by the image capturing sections 12101 to 12104 are superimposed, thereby obtaining a bird's eye view image from above the vehicle 12100.

At least one of the image capturing sections 12101 to 12104 may have a function of acquiring distance information. For example, at least one of the image capturing sections 12101 to 12104 may be a stereo camera including a plurality of image capturing elements, or may be an image capturing element with pixels for phase difference detection.

For example, the microcomputer 12051 can extract a three-dimensional object traveling at a predetermined speed (for example, 0 km/h or higher) in substantially the same direction as that of the vehicle 12100, particularly, the closest three-dimensional object on a traveling path of the vehicle 12100, as a preceding vehicle, by calculating a distance to each three-dimensional object in the image capturing ranges 12111 to 12114, and a temporal change (relative speed with respect to the vehicle 12100) in the distance on the basis of the distance information acquired from the image capturing sections 12101 to 12104. Moreover, the microcomputer 12051 can set an inter-vehicle distance to be secured in advance for a preceding vehicle, and can perform an automatic brake control (including a following stop control), an automatic acceleration control (including a following start control), and the like. As described above, a cooperative control for the purpose of an automatic driving in which a vehicle autonomously travels without an operation by a driver, or the like, can be performed.

For example, the microcomputer 12051 can classify and extract three-dimensional object data related to a three-dimensional object as a two-wheeled vehicle, an ordinary vehicle, a large vehicle, a pedestrian, and another three-dimensional object such as a power pole, on the basis of the distance information obtained from the image capturing sections 12101 to 12104, and use a result of the classification and extraction for automatic avoidance of obstacles. For example, the microcomputer 12051 identifies an obstacle around the vehicle 12100 as an obstacle that is visible to the driver of the vehicle 12100 or an obstacle that is hardly visible. Then, the microcomputer 12051 determines a collision risk indicating a risk of collision with each obstacle, and in a case where the collision risk is equal to or higher than a set value and there is a possibility of collision, the microcomputer 12051 can output an alarm to the driver through the audio speaker 12061 or the display section 12062 or perform forced deceleration or avoidance steering through the driving system control unit 12010 to perform driving assistance for collision avoidance.

At least one of the image capturing sections 12101 to 12104 may be an infrared camera that detects infrared rays. For example, the microcomputer 12051 can recognize a pedestrian by determining whether or not a pedestrian is present in captured images of the image capturing sections 12101 to 12104. Such a recognition of a pedestrian is performed through a procedure for extracting feature points in the captured images of the image capturing sections 12101 to 12104 that are, for example, infrared cameras, and a procedure for discriminating whether or not an object is a pedestrian by performing pattern matching processing on a series of feature points indicating an outline of the object. In a case where the microcomputer 12051 determines that a pedestrian is present in the captured images of the image capturing sections 12101 to 12104 and recognizes the pedestrian, the voice and image output section 12052 controls the display section 12062 to superimpose a rectangular contour line for emphasis on the recognized pedestrian. Furthermore, the voice and image output section 12052 may control the display section 12062 to display an icon or the like indicating a pedestrian at a desired position.

Hereinabove, an example of the vehicle control system to which the technology according to the present disclosure can be applied has been described. The technology according to the present disclosure can be applied to the image capturing section 12031 and the like in the configuration described above. Specifically, the image capturing element 1 in FIG. 1 can be applied to the image capturing sections 12031 and 12101 to 12104. The occurrence of crosstalk can be reduced by applying the technology according to the present disclosure to the image capturing section 12031 or the like and thus a clearer image of an operational site can be obtained, such that it is possible to reduce fatigue of the driver.

Lastly, the description of each of the above-described embodiments is an example of the present technology, and the present technology is not limited to the above-described embodiments. Therefore, it goes without saying that various changes can be made according to the design and the like, other than the embodiments described above, as long as they do not depart from the technical idea of the present technology.

Note that the present technology can have the following configuration.

(1) An image capturing element including:

a pixel that includes a photoelectric conversion section formed on a semiconductor substrate and configured to perform photoelectric conversion based on incident light, a pixel circuit configured to generate an image signal according to a charge generated by the photoelectric conversion, and a wiring layer arranged on a surface of the semiconductor substrate and configured to transmit any one of the image signal or a signal applied to the pixel circuit, the surface being different from a surface of the semiconductor substrate on which the incident light is incident; and a polarization section that is arranged between the semiconductor substrate and the wiring layer and allows transmission of light in a specific polarization direction among the incident light transmitted through the photoelectric conversion section.

(2) The image capturing element according to (1), in which the polarization section is configured with a wire grid.

(3) The image capturing element according to (1) or (2), in which a plurality of the polarization sections is arranged between the semiconductor substrate and the wiring layer.

(4) The image capturing element according to (3), in which the plurality of polarization sections are configured to implement the same polarization direction.

(5) The image capturing element according to any one of (1) to (4), in which the polarization section is formed simultaneously with the wiring layer.

(6) The image capturing element according to any one of (1) to (5), in which the image capturing element includes:
 a plurality of the pixels arranged two-dimensionally; and
 the polarization section arranged in each of the plurality of pixels.

(7) The image capturing element according to (6), in which in the plurality of polarization sections, adjacent polarization sections are configured to implement different polarization directions, respectively.

(8) The image capturing element according to (6), in which each of the plurality of pixels further includes one of a plurality of color filters that allows transmission of light having different wavelengths among the incident light and makes the light transmitted therethrough be incident on the photoelectric conversion section.

(9) The image capturing element according to (8), in which
 the polarization section arranged in the pixel including a color filter that allows transmission of light having a predetermined wavelength among the plurality of color filters is configured to implement a polarization direction different from that of an adjacent polarization section.

(10) The image capturing element according to (9), in which the color filter that allows transmission of the light having the predetermined wavelength is a color filter that allows transmission of red light.

(11) The image capturing element according to (9), in which the color filter that allows transmission of the light having the predetermined wavelength is a color filter that allows transmission of white light.

(12) The image capturing element according to (9), in which the color filter that allows transmission of the light having the predetermined wavelength is a color filter that allows transmission of infrared light.

(13) The image capturing element according to (6), in which each of the plurality of pixels further includes a second polarization section that allows transmission of light in a specific polarization direction among the incident light and makes the light transmitted therethrough be incident on the photoelectric conversion section.

(14) The image capturing element according to (13), in which the second polarization section is configured to implement the same polarization direction as that of the polarization section arranged in the pixel in which the second polarization section is arranged.

(15) The image capturing element according to (13), in which the second polarization section is configured to implement a polarization direction different from that of the polarization section arranged in the pixel in which the second polarization section is arranged.

(16) An image capturing device including:
 a pixel that includes a photoelectric conversion section formed on a semiconductor substrate and configured to perform photoelectric conversion based on incident light,
 a pixel circuit configured to generate an image signal according to a charge generated by the photoelectric conversion, and
 a wiring layer arranged on a surface of the semiconductor substrate and configured to transmit any one of the image signal or a signal applied to the pixel circuit, the surface being different from a surface of the semiconductor substrate on which the incident light is incident;
 a polarization section that is arranged between the semiconductor substrate and the wiring layer and allows transmission of light in a specific polarization direction among the incident light transmitted through the photoelectric conversion section; and
 a processing circuit that processes the transmitted image signal.

REFERENCE SIGNS LIST 1, 1002 Image capturing element
10 Pixel array section
20 Vertical driving section
30 Column signal processing section
40 Control section
100 Pixel
101 Photoelectric conversion section
102 Charge holding section
103 to 106 MOS transistor
121, 132 Insulating layer
122 Via plug
123, 123a, 123b, 123c, 123d, 123e, 123f, 124, 125 Wiring layer
130, 130a, 130b, 160, 170 Polarization section
131 Light absorbing layer
133 Light reflecting layer
134 Metal barrier/plating seed layer
135 Cu wiring layer
136 Insulating film barrier layer
139 Light-shielding line
141 Semiconductor substrate
154 Color filter
1000 Camera
1005 Image processing section
11402, 12031, 12101 to 12104 Image capturing section

The invention claimed is:
1. An image capturing element, comprising:
 a plurality of pixels, wherein each of the plurality of pixels includes:
  a photoelectric conversion section on a semiconductor substrate, wherein the photoelectric conversion section is configured to generate a charge based on photoelectric conversion of incident light;
  a pixel circuit configured to generate an image signal based on the generated charge;
  a wiring layer on a surface of the semiconductor substrate, wherein
   the wiring layer is configured to transmit one of the image signal or a signal applied to the pixel circuit, and
   the surface is different from a surface of the semiconductor substrate on which the incident light is incident; and
  a first polarization section between the semiconductor substrate and the wiring layer, wherein
   the first polarization section is configured to transmit light corresponding to the incident light transmitted through the photoelectric conversion section,
   the light is transmitted in a first polarization direction,
   the first polarization direction of the first polarization section in a first pixel of the plurality of pixels is different from the first polarization direction of the first polarization section in a second pixel of the plurality of pixels, and the second pixel is adjacent to the first pixel.

2. The image capturing element according to claim 1, wherein the first polarization section is configured with a wire grid.

3. The image capturing element according to claim 1, wherein each pixel of the plurality of pixels comprises a plurality of polarization sections between the semiconductor substrate and the wiring layer.

4. The image capturing element according to claim 3, wherein, for each of the plurality of pixels, each polarization section of the plurality of polarization sections is configured to transmit the light in the first polarization direction.

5. The image capturing element according to claim 1, wherein the first polarization section and the wiring layer are on a same level.

6. The image capturing element according to claim 1, wherein the plurality of the pixels is in a two-dimensional arrangement.

7. The image capturing element according to claim 6, wherein each of the plurality of pixels further includes one of a plurality of color filters configured to:

transmit the incident light associated with a specific wavelength; and allow the transmitted incident light to be incident on the photoelectric conversion section.

8. The image capturing element according to claim 7, wherein the first pixel includes a first color filter of the plurality of color filters, the second pixel includes a second color filter of the plurality of color filters, and the first color filter is different from the second color filter.

9. The image capturing element according to claim 7, wherein the one of a plurality of color filters is a color filter configured to transmit red light.

10. The image capturing element according to claim 7, wherein the one of a plurality of color filters is a color filter configured to transmit white light.

11. The image capturing element according to claim 7, wherein the one of a plurality of color filters is a color filter configured to transmit infrared light.

12. The image capturing element according to claim 1, wherein each of the plurality of pixels further includes a second polarization section configured to:

transmit the incident light in a second polarization direction; and allow the transmitted incident light to be incident on the photoelectric conversion section.

13. The image capturing element according to claim 12, wherein the second polarization direction of the second polarization section is same as the first polarization direction of the first polarization section corresponding to a pixel of the second polarization section.

14. The image capturing element according to claim 12, wherein the second polarization direction of the second polarization section is different from the first polarization direction of the first polarization section corresponding to a pixel of the second polarization section.

15. An image capturing device, comprising:

a plurality of pixels, wherein each of the plurality of pixels includes:

a photoelectric conversion section on a semiconductor substrate, wherein the photoelectric conversion section is configured to generate a charge based on photoelectric conversion of incident light;

a pixel circuit configured to generate an image signal based on the generated charge;

a wiring layer on a surface of the semiconductor substrate, wherein the wiring layer is configured to transmit one of the image signal or a signal applied to the pixel circuit, and the surface is different from a surface of the semiconductor substrate on which the incident light is incident;

a polarization section between the semiconductor substrate and the wiring layer, wherein the polarization section is configured to transmit light corresponding to the incident light transmitted through the photoelectric conversion section, the light is transmitted in a specific polarization direction, the specific polarization direction of the polarization section in a first pixel of the plurality of pixels is different from the specific polarization direction of the polarization section in a second pixel of the plurality of pixels, and the second pixel is adjacent to the first pixel; and a processing circuit configured to process the image signal.

* * * * *